US011721711B2

(12) United States Patent
Kanesada et al.

(10) Patent No.: US 11,721,711 B2
(45) Date of Patent: Aug. 8, 2023

(54) PHOTOELECTRIC CONVERSION DEVICE

(71) Applicant: CANON KABUSHIKI KAISHA, Tokyo (JP)

(72) Inventors: Takayasu Kanesada, Yamato (JP); Koji Hara, Ichikawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 274 days.

(21) Appl. No.: 16/879,016

(22) Filed: May 20, 2020

(65) Prior Publication Data

US 2020/0381469 A1 Dec. 3, 2020

(30) Foreign Application Priority Data

May 27, 2019 (JP) ................................. 2019-098499

(51) Int. Cl.
*H01L 27/146* (2006.01)
*H04N 25/772* (2023.01)

(52) U.S. Cl.
CPC .... *H01L 27/14627* (2013.01); *H01L 27/1464* (2013.01); *H01L 27/14636* (2013.01); *H04N 25/772* (2023.01)

(58) Field of Classification Search
CPC ......... H01L 27/14627; H01L 27/14636; H01L 27/1464; H01L 27/14621; H04N 5/37455
See application file for complete search history.

(56) References Cited

U.S. PATENT DOCUMENTS

| | | | |
|---|---|---|---|
| 6,448,592 B1 | 9/2002 | Peek et al. | |
| 8,976,282 B2 | 3/2015 | Soda | |
| 9,673,253 B2 | 6/2017 | Hara et al. | |
| 2009/0302408 A1 | 12/2009 | Nakagawa et al. | |
| 2014/0132812 A1 | 5/2014 | Soda | |

(Continued)

FOREIGN PATENT DOCUMENTS

| | | |
|---|---|---|
| JP | 2011-82386 A | 4/2011 |
| JP | 2011-258884 A | 12/2011 |

(Continued)

OTHER PUBLICATIONS

Notification of Reasons for Refusal in Japanese Application No. 2019-098499 (dated May 2023).

*Primary Examiner* — Herve-Louis Y Assouman
(74) *Attorney, Agent, or Firm* — Venable LLP

(57) ABSTRACT

A disclosed photoelectric conversion device includes: a semiconductor layer in which a photoelectric converter is provided; a substrate arranged on one face side of the semiconductor layer; and an interconnection structure arranged between the semiconductor layer and the substrate. The interconnection structure includes a first insulating film made of a first insulating material and a second insulating film provided on the semiconductor layer side of the first insulating film and made of a second insulating material, the first insulating material permeates more hydrogen than the second insulating material, an insulating member made of the first insulating material is located between the first insulating film and the semiconductor layer, and the first insulating film and the insulating member are connected to each other via an opening provided in the second insulating film.

20 Claims, 18 Drawing Sheets

(56) References Cited

U.S. PATENT DOCUMENTS

| | | | |
|---|---|---|---|
| 2015/0221694 A1* | 8/2015 | Baba | H01L 27/14636 |
| | | | 257/443 |
| 2016/0218125 A1 | 7/2016 | Yamaguchi | |
| 2016/0233262 A1 | 8/2016 | Goto | |
| 2016/0268332 A1* | 9/2016 | Kanesada | H01L 27/14629 |
| 2016/0343750 A1 | 11/2016 | Ishino et al. | |
| 2017/0062497 A1 | 3/2017 | Goto | |
| 2018/0006071 A1* | 1/2018 | Kato | H01L 27/14625 |
| 2018/0315789 A1 | 11/2018 | Takahashi et al. | |

FOREIGN PATENT DOCUMENTS

| | | |
|---|---|---|
| JP | 2016-032045 A | 3/2016 |
| JP | 2016-134614 A | 7/2016 |
| JP | 2016-219550 A | 12/2016 |
| JP | 2018-186211 A | 11/2018 |
| WO | 98/11608 A1 | 3/1998 |
| WO | 2014/050694 A1 | 4/2014 |

* cited by examiner

PHOTOELECTRIC CONVERSION DEVICE

BACKGROUND OF THE INVENTION

Field of the Invention

The present invention relates to a photoelectric conversion device.

Description of the Related Art

In recent years, a backside irradiation type sensor and a stacked type sensor in which a sensor and a signal processing circuit such as an AD conversion circuit are stacked have been proposed in photoelectric conversion devices represented by a solid-state imaging device or the like in order to achieve reduction in size, higher sensitivity, multi-functionality, or the like. Japanese Patent Application Laid-Open No. 2016-032045 discloses structure and a manufacturing method of a stacked type sensor.

Further, while higher sensitivity or reduction in size of a photoelectric conversion device has been achieved, there is a demand for reduction in noise that occurs due to influence of a crystal defect in a silicon or an interface state between a silicon and an insulating film. In recent years, a technology of reducing noise or dark current that occurs near a photoelectric conversion element by using a dangling bond termination effect of hydrogen has been proposed.

In the solid-state imaging device disclosed in Japanese Patent Application Laid-Open No. 2016-032045, however, a plurality of layers whose film types are different such as a diffusion prevention layer for an interconnection material or an interlayer insulating layer between interconnections are stacked in a lower layer of a photoelectric converter. Some of these multiple layers may prevent permeation of hydrogen, the photoelectric converter is not supplied with sufficient hydrogen, and a sufficient dangling bond termination effect caused by hydrogen may not be obtained.

SUMMARY OF THE INVENTION

The present invention intends to provide a photoelectric conversion device that may effectively reduce noise occurring due to influence of a crystal defect in a silicon or an interface state between a silicon and an insulating film.

According to one aspect of the present invention, provides is a photoelectric conversion device including a semiconductor layer in which a photoelectric converter is provided, a substrate arranged on one face side of the semiconductor layer, and an interconnection structure arranged between the semiconductor layer and the substrate, wherein the interconnection structure includes a first insulating film made of a first insulating material and a second insulating film provided on the semiconductor layer side of the first insulating film and made of a second insulating material, wherein the first insulating material permeates more hydrogen than the second insulating material, and wherein an insulating member made of the first insulating material is located between the first insulating film and the semiconductor layer, and the first insulating film and the insulating member are connected to each other via an opening provided in the second insulating film.

Further, according to another aspect of the present invention, provided is a photoelectric conversion device including a semiconductor layer in which a pixel region including a plurality of pixels each including a photoelectric converter is provided, a substrate arranged on one face side of the semiconductor layer, and an interconnection structure arranged between the semiconductor layer and the substrate, wherein the interconnection structure includes a first insulating film made of a first insulating material and a second insulating film provided on the semiconductor layer side of the first insulating film and made of a second insulating material, wherein the first insulating material permeates more hydrogen than the second insulating material, wherein an insulating member made of the first insulating material is located between the first insulating film and the semiconductor layer, and the first insulating film and the insulating member are connected to each other via an opening provided in the second insulating film, and wherein an opening area of the opening provided in a region corresponding to a first pixel is larger than an opening area of the opening provided in a region corresponding to a second pixel.

Further, according to yet another aspect of the present invention, provided is a photoelectric conversion device including a semiconductor layer in which a pixel region including a plurality of pixels each including a photoelectric converter is provided, a substrate arranged on one face side of the semiconductor layer, and an interconnection structure arranged between the semiconductor layer and the substrate, wherein the interconnection structure includes a plurality of first insulating films made of a first insulating material and a plurality of second insulating films made of a second insulating material and has a multilayer stack in which the first insulating films and the second insulating films are stacked alternately from the semiconductor layer side, wherein the first insulating material permeates more hydrogen than the second insulating material, wherein the photoelectric conversion device further includes an insulating member having a more hydrogen content than the first insulating films inside one of the first insulating films which is the closest to the semiconductor layer or on the other face side of the semiconductor layer, and wherein a volume of the insulating member provided in a portion corresponding to a first pixel is larger than a volume of the insulating member provided in a portion corresponding to a second pixel.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A photoelectric conversion device and a method of manufacturing the same according to a first embodiment of the present invention will be described with reference to FIG. 1 to FIG. 4C.

Figure 1:
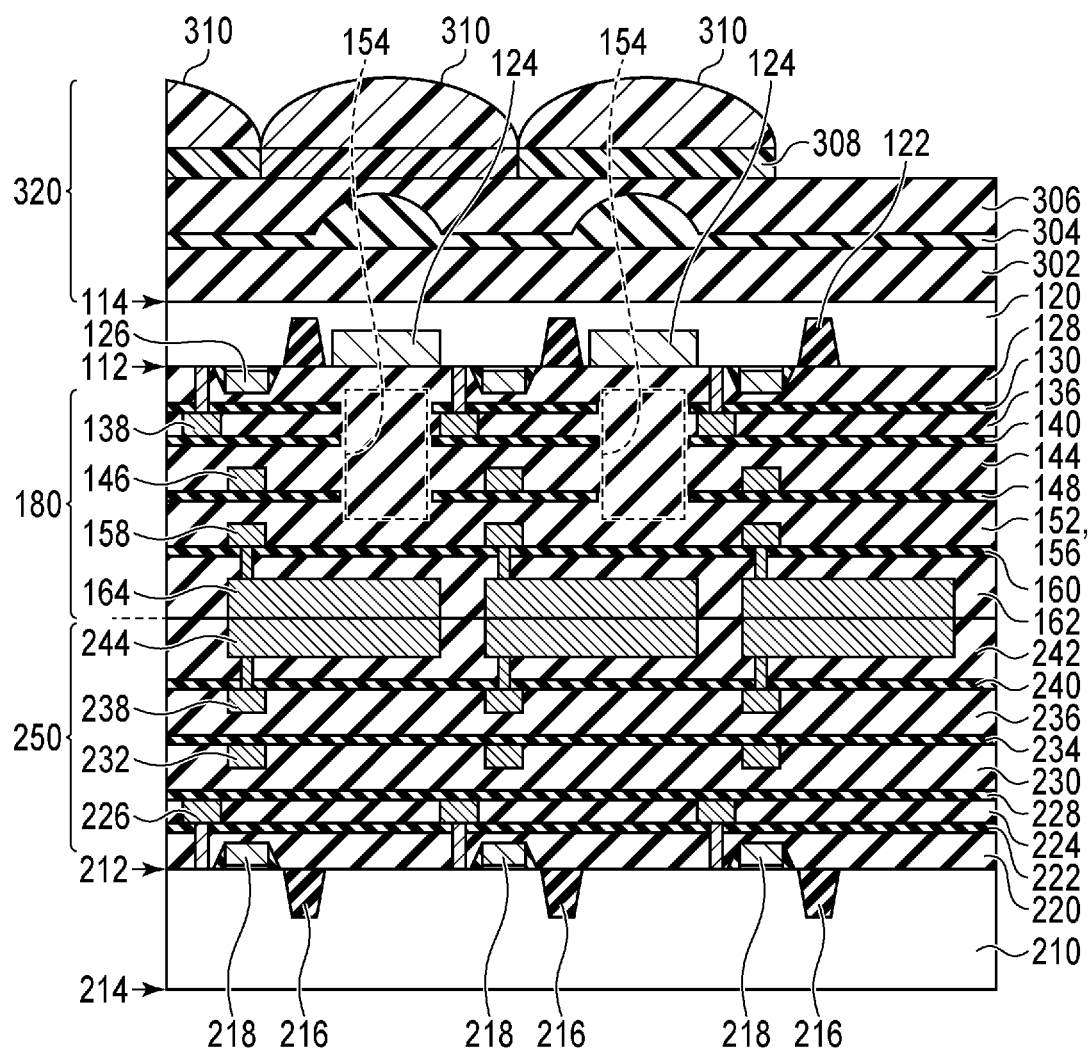
FIG. 1 is a cross-sectional view illustrating a general configuration of a photoelectric conversion device according to a first embodiment of the present invention.

First, a general configuration of the photoelectric conversion device according to the present embodiment will be described with reference to FIG. 1. FIG. 1 is a schematic cross-sectional view of the photoelectric conversion device according to the present embodiment.

As illustrated in FIG. 1, the photoelectric conversion device according to the present embodiment includes a semiconductor substrate 210, interconnection structures 250 and 180, a semiconductor layer 120, and an optical structure 320. The semiconductor substrate 210 has a pair of a first face 212 and a second face 214 forming surfaces opposed to each other. The interconnection structures 250 and 180, the semiconductor layer 120, and the optical structure 320 are stacked in this order over the first face 212 side of the semiconductor substrate 210.

Element isolation portions 216 and MOS transistors including gate electrodes 218 are provided on the first face 212 side of the semiconductor substrate 210. A predetermined signal processing unit such as an analog-to-digital (AD) convertor circuit unit may be arranged on the semiconductor substrate 210 side.

The interconnection structure 250 includes insulating films 220, 222, 224, 228, 230, 234, 236, 240, and 242 stacked in this order from the semiconductor substrate 210 side and a plurality of interconnection layers arranged therein. Out of metal members formed of such a plurality of interconnection layers, FIG. 1 illustrates interconnections 226, 232, 238, and 244 arranged in different layers.

The interconnection structure 180 includes insulating films 162, 160, 152, 156, 148, 144, 140, 136, 130, and 128 stacked in this order from the semiconductor substrate 210 side and a plurality of interconnection layers arranged therein. Out of metal members formed of such a plurality of interconnection layers, FIG. 1 illustrates interconnections 164, 158, 146, and 138 arranged in different layers.

The interconnection structure 180 and the interconnection structure 250 are stacked such that the insulating film 162 and the insulating film 242 face each other, and the interconnection 244 of the interconnection structure 250 and the interconnection 164 of the interconnection structure 180 are electrically connected to each other.

Out of insulating films forming the interconnection structures 180 and 250, the insulating film 128, 136, 144, 152, 156, 162, 220, 224, 230, 236, and 242 are each formed of an insulating material having a relatively low relative dielectric constant in general in terms of reduction in the inter-interconnection capacitance. The insulating material having a relatively low relative dielectric constant may be, for example, silicon oxide, silicon oxycarbide, or the like. The insulating material such as silicon oxide, silicon oxycarbide, or the like has a property of permeating hydrogen.

On the other hand, the insulating films 130, 140, 148, 160, 222, 228, 234, and 240 each have a role as an etching stopper film during formation of the interconnections 138, 146, 158, 164, 226, 232, 238, and 244 or a diffusion prevention film for interconnection materials. In such a role, the insulating films 130, 140, 148, 160, 222, 228, 234, and 240 are each formed of silicon carbide, silicon carbonitride, silicon nitride, or the like, for example. The insulating material such as silicon carbide, silicon carbonitride, silicon nitride, or the like has a property of preventing diffusion of hydrogen.

In such a way, the interconnection structures 180 and 250 each have a multilayer stack in which a plurality of first insulating films formed of insulating materials that permeates hydrogen and a plurality of second insulating films formed of insulating materials that prevent diffusion of hydrogen are stacked alternately. The first insulating material forming the first insulating film permeates more hydrogen than the second insulating material forming the second insulating film.

The semiconductor layer 120 has a pair of a first face 112 and a second face 114 forming surfaces opposed to each other. The semiconductor layer 120 is in contact with the interconnection structure 180 on one face side, that is, the first face 112 side. A plurality of pixels, each of which includes a photoelectric converter 124 and a MOS transistor including the gate electrode 126, and an element isolation portion 122 are provided on the first face 112 side of the semiconductor layer 120. The plurality of pixels is arranged in an array to form a pixel region. An optical structure 320 is provided over the other face side, that is, the second face 114 side of the semiconductor layer 120.

The optical structure 320 includes an insulating film 302, an inner-layer lens 304, an insulating film 306, a color filter layer 308, and micro-lenses 310 provided in this order from the second face 114 side of the semiconductor layer 120. The inner-layer lens 304, the color filter layer 308, and the micro-lens 310 are provided in association with each of the plurality of pixels.

In such a way, the photoelectric conversion device according to the present embodiment is a stacked type sensor and also is a backside irradiation type sensor.

In the photoelectric conversion device according to the present embodiment here, openings 154 are provided in the insulating films 130, 140, and 148, and an insulator made of the same insulating material as the insulating films 128, 136, 144, 152, and 156 is arranged in the opening 154. In other words, the insulating films 128, 136, 144, 152, and 156 are connected to the semiconductor layer 120 by an insulating material that permeates hydrogen via the opening 154 provided in the insulating films 130, 140, and 148. That is, paths that diffuse hydrogen are provided between the insulating films 128, 136, 144, 152, and 156 and the semiconductor layer 120.

One of the factors to cause noise or dark current to occur near the photoelectric converter 124 may be influence of a crystal defect in the semiconductor layer 120 and dangling bond at the interface between the semiconductor layer 120 and the insulating film 130. In this regard, a technology of reducing noise or dark current near the photoelectric converter 124 by using a dangling bond termination effect of hydrogen is known.

It is possible to supply hydrogen to the dangling bond from an insulating film containing hydrogen as an example. For example, silicon oxide or silicon oxycarbide deposited by a deposition apparatus using plasma, such as a parallel plate plasma CVD apparatus or a high density plasma CVD apparatus, contains hydrogen and thus can be used as a hydrogen supply source. In the present embodiment, the insulating films 128, 136, 144, 152, 156, and 162 can be used as a hydrogen supply source.

However, since insulating materials generally used as an etching stopper film or a diffusion prevention film have low hydrogen permeability, the insulating films 130, 140, 148, and 160 formed of such insulating materials prevent diffusion of hydrogen. Further, titanium nitride or tantalum nitride forming a barrier metal of the interconnections 138, 146, 158, and 164 also prevent diffusion of hydrogen. Thus, if the insulating films 130, 140, 148, and 160 are arranged on the entire surface except contact portions, hydrogen contained in the insulating films 136, 144, 152, 156, and 162 cannot be used for dangling bond termination. As a result, noise or dark current occurring near the photoelectric converter 124 is not be reduced sufficiently.

In terms of the above, in the photoelectric conversion device according to the present embodiment, the opening 154 is provided in the insulating films 130, 140, and 148 to enable hydrogen to be supplied from the insulating films 128, 136, 144, 152, and 156 to the photoelectric converter 124. With such a configuration, it is possible to enhance a dangling bond termination effect caused by hydrogen and effectively reduce noise or dark current occurring near the photoelectric converter 124.

The opening 154 is provided in a region of at least a part of the insulating films 130, 140, and 148. In terms of efficient hydrogen supply to the photoelectric converter 124, it is preferable that at least a part of the opening 154 and the photoelectric converter 124 overlap in a projection plane when vertically projected on the projection plane parallel to the primary face (for example, the first face 112) of the semiconductor layer 120. The openings 154 provided in the insulating films 130, 140, and 148 are not necessarily required to be overlapped in the projection plane.

Further, the opening 154 is provided in one or more insulating films on the photoelectric converter 124 side out of the insulating films 130, 140, 148, and 160. That is, the opening 154 may be formed only in the insulating film 130, the openings 154 may be formed in the insulating films 130 and 140, or the openings 154 may be formed in the insulating films 130, 140, 148, and 160. The insulating film in which the opening 154 is to be provided can be selected as appropriate in accordance with a relationship between a hydrogen supply capacity from the insulating films 130, 140, 148, and 160 to the photoelectric converter 124 and a noise reduction effect or the like. The same applies to a case where the total number of insulating films that prevent diffusion of hydrogen is five or greater.

When hydrogen is supplied from the insulating films 128, 136, 144, 152, 156, and 162 to the photoelectric converter 124, a heat treatment for facilitating diffusion of hydrogen may be performed. Such a heat treatment may be performed in an atmosphere containing hydrogen (for example, a forming gas atmosphere).

Next, a method of manufacturing the photoelectric conversion device according to the present embodiment will be described with reference to FIG. 2A to FIG. 4C. FIG. 2A to FIG. 4C are cross-sectional views illustrating the method of manufacturing the photoelectric conversion device according to the present embodiment.

First, a semiconductor substrate 110 is prepared as a base material of a first component 100. The semiconductor substrate 110 is a silicon substrate, for example, and has a pair of the first face 112 and the second face 114 forming surfaces opposed to each other.

Figure 2A:
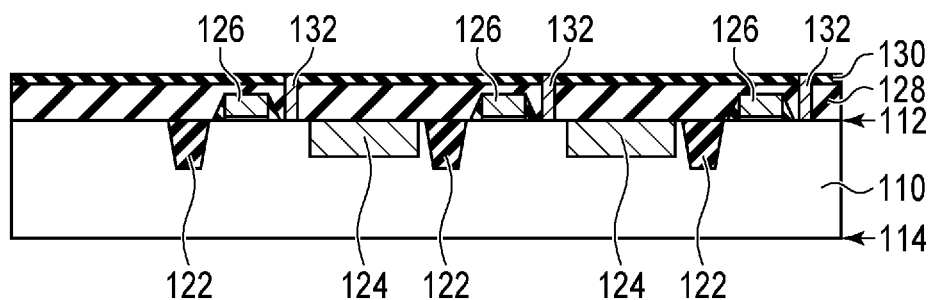
FIG. 2A, FIG. 2B, FIG. 2C, FIG. 2D, FIG. 2E, and FIG. 2F are cross-sectional views (part 1) illustrating a method of manufacturing a photoelectric conversion device according to the first embodiment of the present invention.

Next, the element isolation portions 122, the photoelectric converters 124, MOS transistors including the gate electrodes 126, the insulating films 128 and 130, contact plugs 132, and the like are formed on the first face 112 side of the semiconductor substrate 110 by a known manufacturing process of semiconductor devices (FIG. 2A).

The insulating film 128 may be formed of silicon oxide, for example. The insulating film 130 may be formed of silicon carbide, for example. For example, after silicon oxide is deposited over the first face 112 of the semiconductor substrate 110 by a CVD method, this silicon oxide surface is planarized to form the insulating film 128 made of a silicon oxide film. Next, silicon carbide is deposited over the insulating film 128 by a CVD method to form the insulating film 130 made of a silicon carbide film. Note that the insulating film 128 may be formed of a silicon oxycarbide film. Further, the insulating film 130 may be formed of a silicon nitride film or a silicon carbonitride film.

The contact plugs 132 may be formed of tungsten and a barrier metal of titanium or titanium nitride, for example. For example, contact holes reaching the semiconductor substrate 110 or the gate electrodes 126 are formed in the insulating films 128 and 130 by photolithography and dry etching. Next, after a barrier metal film and a tungsten film are deposited by a sputtering method or a CVD method, the barrier metal film and the tungsten film on the insulating film 130 are removed by a CMP method or etch back to form the contact plugs 132 provided in the contact holes.

Figure 2B:
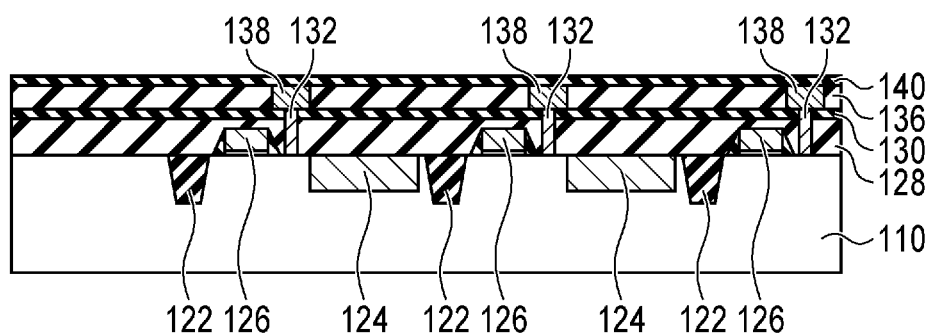

Next, the insulating film 136, the interconnection 138 arranged inside the insulating film 136, the insulating film 140 arranged over the insulating film 136 and the interconnection 138, and the like are formed over the insulating film 130 by a known manufacturing process of semiconductor devices (FIG. 2B).

The insulating film 136 may be formed of silicon oxide, for example. The interconnection 138 may be formed of a conductive material whose primary composition is copper, for example. The insulating film 140 may be formed of silicon carbide, for example. For example, silicon oxide is deposited over the insulating film 130 by a CVD method to form the insulating film 136 made of a silicon oxide film. Next, the interconnection 138 made of a conductive material whose primary composition is copper is formed inside the insulating film 136 by a known single damascene process. The insulating film 130 has a role as an etching stopper film when an interconnection groove in which the interconnection 138 is to be provided is formed and a role as a diffusion prevention film for the material forming the interconnection 138. Next, silicon carbide is deposited over the insulating film 136 and the interconnection 138 by a CVD method, for example, to form the insulating film 140 made of a silicon carbide film. Note that the insulating film 136 may be formed of a silicon oxycarbide film. Further, the insulating film 140 may be formed of a silicon nitride film or a silicon carbonitride film.

Figure 2C:
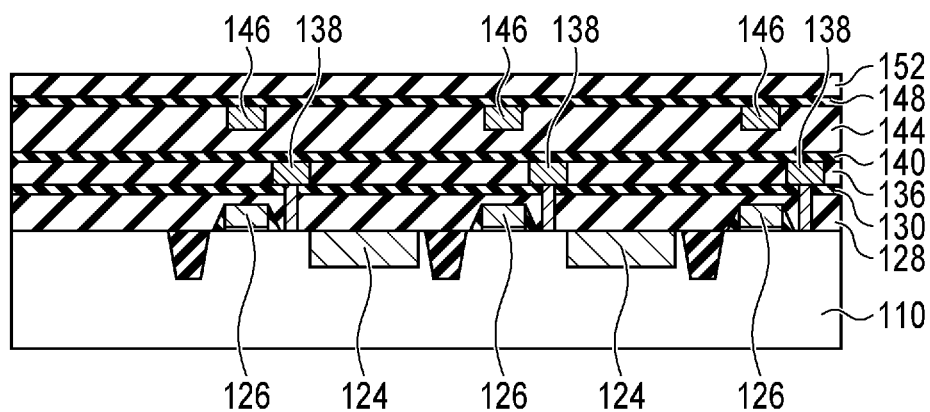

Next, the insulating film 144, the interconnection 146 arranged inside the insulating film 144, the insulating film 148 arranged over the insulating film 144 and the interconnection 146, the insulating film 152 arranged over the insulating film 148, and the like are formed on the insulating film 140 by a known manufacturing process of semiconductor devices (FIG. 2C).

The insulating films 144 and 152 may be formed of silicon oxide, for example. The interconnection 146 may be formed of a conductive material whose primary composition is copper, for example. The insulating film 148 may be formed of silicon carbide, for example. For example, silicon oxide is deposited over the insulating film 140 by a CVD method to form the insulating film 144 made of a silicon oxide film. Next, the interconnection 146 made of the conductive material whose primary composition is copper is formed inside the insulating film 144 by a known dual damascene process. The insulating film 148 has a role as a diffusion prevention film for the material forming the interconnections 138 and 146. Next, silicon carbide is deposited over the insulating film 144 and the interconnection 146 by a CVD method, for example, to form the insulating film 148 made of a silicon carbide film. Next, silicon oxide is deposited over the insulating film 148 by a CVD method, for example, to form the insulating film 152 made of a silicon oxide film. Note that the insulating films 144 and 152 may be formed of a silicon oxycarbide film. Further, the insulating film 148 may be formed of a silicon nitride film or a silicon carbonitride film.

Figure 2D:
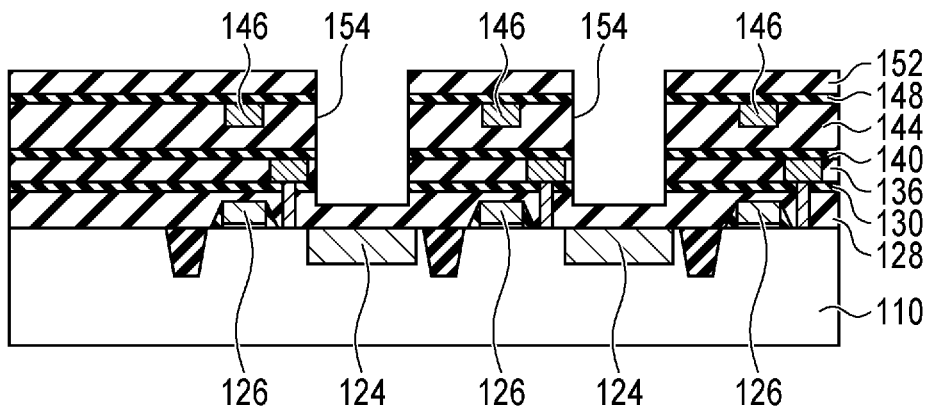

Next, the openings 154 reaching at least the insulating film 128 are formed in the insulating films 130, 136, 140, 144, 148, and 152 on the photoelectric converters 124 by using photolithography or dry etching (FIG. 2D).

The openings 154 are formed by etching the insulating films 152, 148, 144, 140, 136, and 130 by using a photoresist film as a mask or using, as a mask, a hard mask film made of an insulating film or the like on which a pattern of a photoresist film is transcribed. For example, it is possible to form the openings 154 by sequentially removing the insulating films 152, 148, 144, 140, 136, and 130 by multiple times of etching with different conditions. Further, an etching stopper film (not illustrated) may be provided in the insulating film 128 to stop etching of the openings 154 in the middle of an insulating film 128d. For example, silicon nitride may be applied to the etching stopper film in such a case.

Next, the insulating film 156 is formed over the entire surface on the first face 112 side including the inside of the openings 154 by a known manufacturing process of semiconductor devices. For example, silicon oxide is deposited by using a deposition apparatus using plasma, such as a parallel plate plasma CVD apparatus or a high density plasma CVD apparatus, to form the insulating film 156 made of a silicon oxide film. Note that the insulating film 156 may be formed of a silicon oxycarbide film. The silicon oxide or the silicon oxycarbide deposited by the deposition apparatus using plasma has high hydrogen permeability and contains a large hydrogen content in the film itself.

Figure 2E:
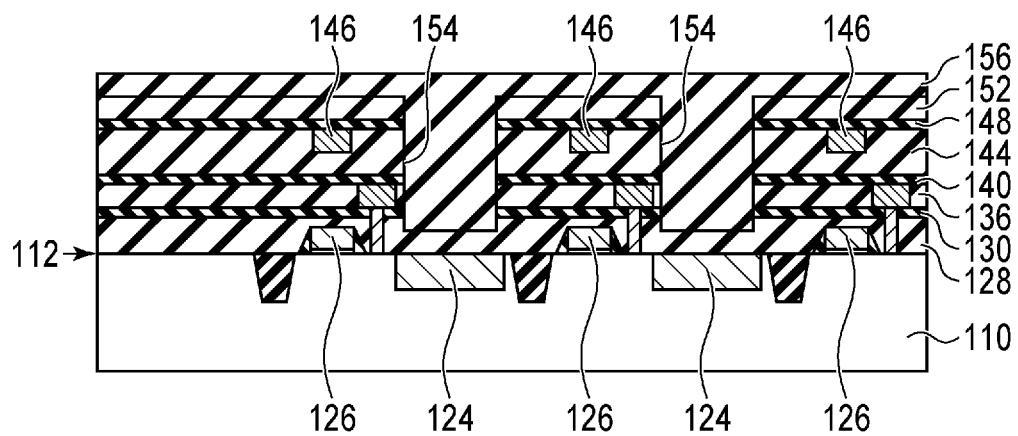

Next, the surface of the insulating film 156 is planarized by using a CMP method to remove steps on the surface that have occurred due to the openings 154 (FIG. 2E).

Figure 2F:
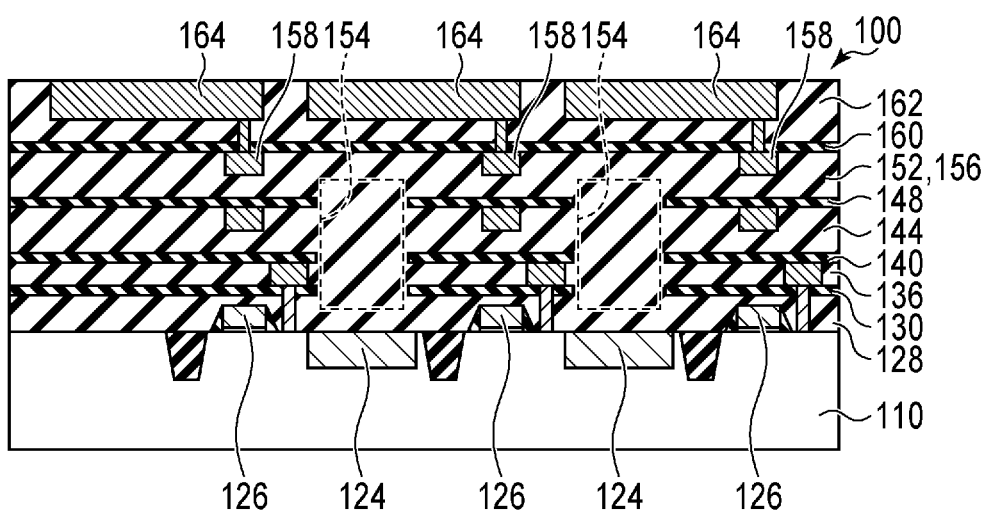

Next, the interconnection 158 arranged inside the insulating films 156 and 152, the insulating films 160 and 162 arranged over the insulating films 152 and 156 and the interconnection 158, the interconnection 164 arranged inside the insulating films 160 and 162, and the like are formed by a known manufacturing process of semiconductor devices (FIG. 2F). The interconnections 158 and 164 may be formed of a conductive material whose primary composition is copper, for example. The insulating film 160 may be formed of silicon carbide, for example. The insulating film 162 may be formed of silicon oxide, for example.

The interconnection 158 made of a conductive material whose primary composition is copper is formed inside the insulating films 156, 152, and 148 by a known dual damascene process, for example. The insulating film 148 has a role as a diffusion prevention film for the material forming the interconnection 158. Next, silicon carbide is deposited over the insulating film 156 and the interconnection 158 by a CVD method, for example, to form the insulating film 160 made of a silicon carbide film. Next, silicon oxide is deposited over the insulating film 160 by a CVD method, for example, to form the insulating film 162 made of a silicon oxide film. Next, the interconnection 164 made of a conductive material whose primary composition is copper is formed inside the insulating films 162 and 160 by a known dual damascene process. The insulating film 160 has a role as a diffusion prevention film for the material forming the interconnections 158 and 164. Note that the insulating film 160 may be formed of a silicon nitride film or a silicon carbonitride film. Further, the insulating film 162 may be formed of a silicon oxycarbide film.

Note that, in the following description, a portion from which the insulating films 130, 140, and 148 have been removed (corresponding to the opening 154) in the process of FIG. 2D will be referred to as the opening 154 even after the insulating film 156 is provided therein. The opening 154 is a portion in which the insulating film 156 made of an insulating material having high hydrogen permeability is provided, which is not a physical hole but can be said to be a hole (opening) that permeates hydrogen viewed from the insulating films 130, 140, and 148 made of insulating materials having a high diffusion prevention effect with respect to hydrogen.

As set forth, the first component 100 including photoelectric conversion elements before joined is completed.

Further, the semiconductor substrate 210 is prepared as a base material of a second component 200 separately from the first component 100. The semiconductor substrate 210 is a silicon substrate, for example, and has a pair of the first face 212 and the second face 214 forming surfaces opposed to each other.

Next, the element isolation portions 216, MOS transistors including the gate electrodes 218, the insulating films 220 and 222, contact plugs 223, and the like are formed on the first face 212 side of the semiconductor substrate 210 by a known manufacturing process of semiconductor devices.

Next, the insulating film 224, the interconnection 226 arranged inside the insulating film 224, the insulating film 228 arranged over the insulating film 224 and the interconnection 226, and the like are formed over the insulating film 222 by a known manufacturing process of semiconductor devices.

Next, the insulating film 230, the interconnection 232 arranged inside the insulating film 230, the insulating film 234 arranged over the insulating film 230 and the interconnection 232, and the like are formed over the insulating film 228 by a known manufacturing process of semiconductor devices.

Next, the insulating film 236, the interconnection 238 arranged inside the insulating film 236, the insulating film 240 arranged over the insulating film 236 and the interconnection 238, and the like are formed over the insulating film 234 by a known manufacturing process of semiconductor devices.

Figure 3:
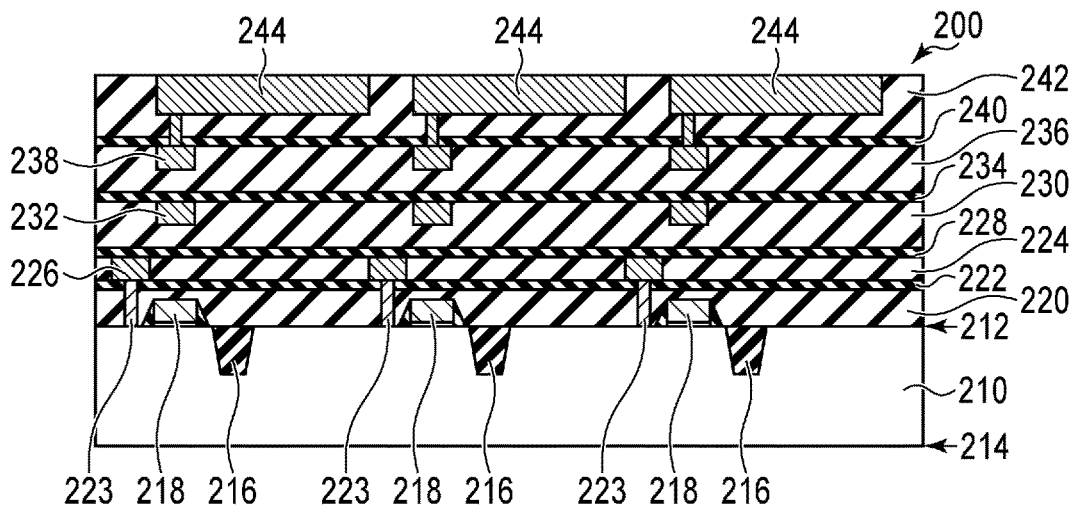
FIG. 3 is a cross-sectional view (part 2) illustrating the method of manufacturing a photoelectric conversion device according to the first embodiment of the present invention.

Next, the insulating film 242, the interconnection 244 arranged inside the insulating film 242, and the like are formed over the insulating film 240 by a known manufacturing process of semiconductor devices (FIG. 3).

The insulating films 220, 224, 230, 236, and 242 may be formed of silicon oxide, for example. The insulating films 222, 228, 234, and 240 may be formed of silicon carbide, for example. The contact plug 223 may be formed of tungsten and a barrier metal of titanium or titanium nitride, for example. The interconnections 226, 232, 238, and 244 may be formed of a conductive material whose primary composition is copper, for example. The insulating film 222 has a role as an etching stopper film when an interconnection groove in which the interconnection 226 is to be provided is formed and a role as a diffusion prevention film for the material forming the interconnection 226. The insulating films 228, 234, and 240 each have a role as a diffusion prevention film for the material forming the interconnections 226, 232, and 238. Note that the insulating films 220, 224, 230, 236, and 242 may be formed of a silicon oxycarbide film. Further, the insulating films 222, 228, 234, and 240 may be formed of a silicon nitride film or a silicon carbonitride film.

As set forth, the second component 200 before joined is completed.

Figure 4A:
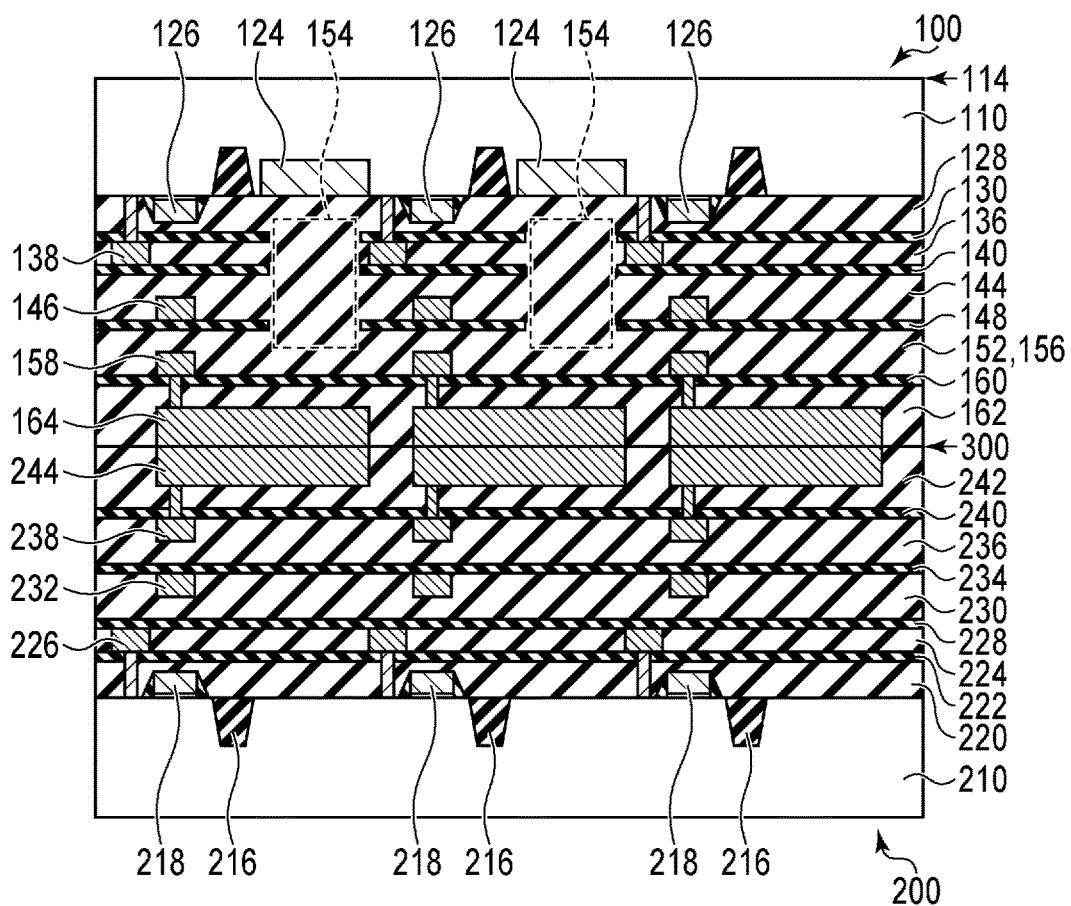
FIG. 4A, FIG. 4B, and FIG. 4C are cross-sectional views (part 3) illustrating the method of manufacturing a photoelectric conversion device according to the first embodiment of the present invention.

Next, the first component 100 and the second component 200 formed in such a way are attached to each other such that the face on the insulating film 162 side and the face on the insulating film 242 side are arranged to face each other. Thereby, the interconnection 164 of the first component 100 and the interconnection 244 of the second component 200 are electrically connected at a junction interface 300 between the first component 100 and the second component 200 (FIG. 4A). Attachment of the first component 100 and the second component 200 may be performed by a joining method partially including a copper interconnection other than by attachment of insulating films such as silicon oxide.

Figure 4B:
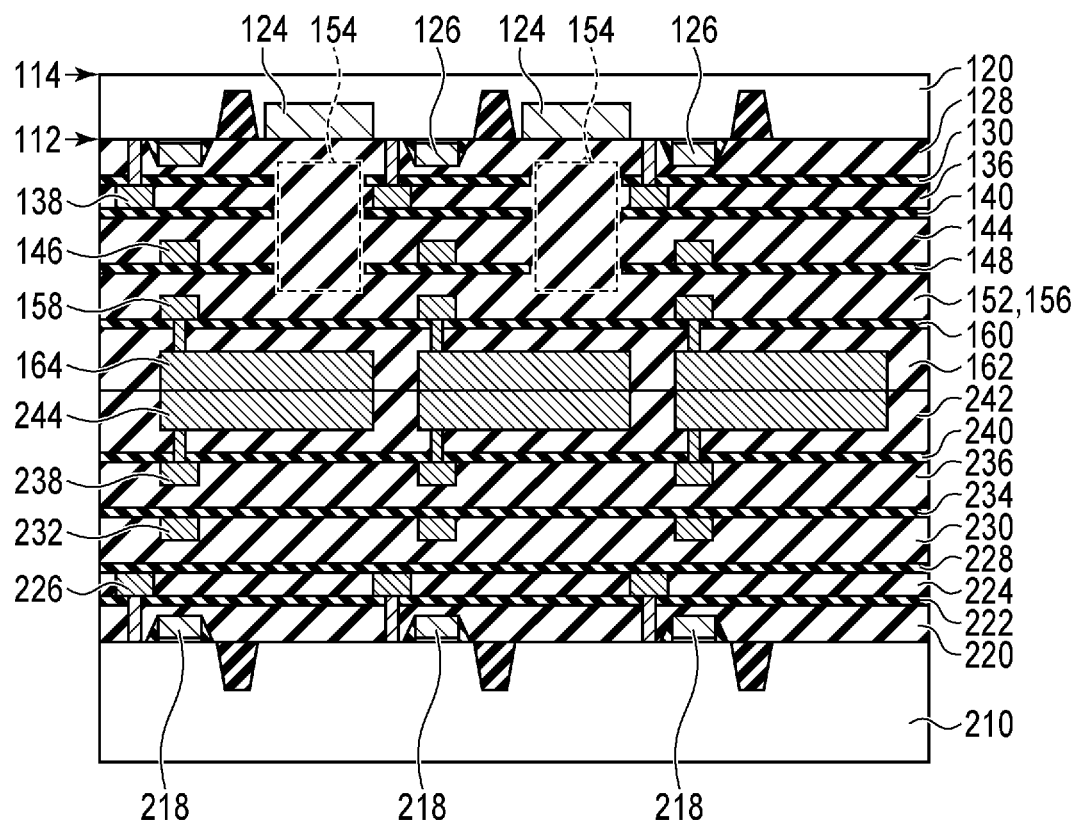

Next, the semiconductor substrate 110 of the first component 100 is thinned to a predetermined thickness from the second face 114 to form the semiconductor layer 120 that is the thinned semiconductor substrate 110 (FIG. 4B). A method of back grind, CMP, etching, or the like may be applied to thinning of the semiconductor substrate 110. Alternatively, another known substrate thinning technique employed in three-dimensional implementation, a through silicon via (TSV) forming process, or the like can be applied. In the following description, a newly exposed surface of the semiconductor layer 120 resulted from thinning of the semiconductor substrate 110 will also be referred to as the second face 114 for the purpose of illustration.

Next, a heat treatment is performed in a nitrogen atmosphere or in a hydrogen containing atmosphere (for example, a forming gas atmosphere). This heat treatment causes hydrogen to be emitted from the insulating films 128, 136, 144, 152, and 156, this hydrogen reaches the photoelectric converter 124 via the opening 154, and thereby dangling bond on the first face 112 side of the semiconductor layer 120 is terminated by hydrogen. In particular, the insulating film 156 formed so as to be provided in the opening 154 is a film deposited by a deposition apparatus using plasma, such as a parallel plate plasma CVD apparatus, a high density plasma CVD apparatus, or the like, and contains a large amount of hydrogen. Therefore, the insulating film 156 can supply sufficient hydrogen to terminate the dangling bond on the first face 112 side of the semiconductor layer 120.

Note that the timing of performing such a heat treatment is not limited to the time after the semiconductor substrate 110 is thinned, and the heat treatment may be performed by using a heat treatment when the first component 100 and the second component 200 are joined or may be performed at a timing before the first component 100 and the second component 200 are joined. Further, such a heat treatment may be performed before the first component 100 and the second component 200 are joined and further performed at the time when of the first component 100 and the second component 200 are joined or after the semiconductor substrate 110 is thinned. Further, when sufficient hydrogen can be diffused to the photoelectric converter 124 by a thermal history of a backend process such as in a course of deposition of the insulating films 156, 160, and 162, it is not necessarily required to perform a separate heat treatment.

Figure 4C:
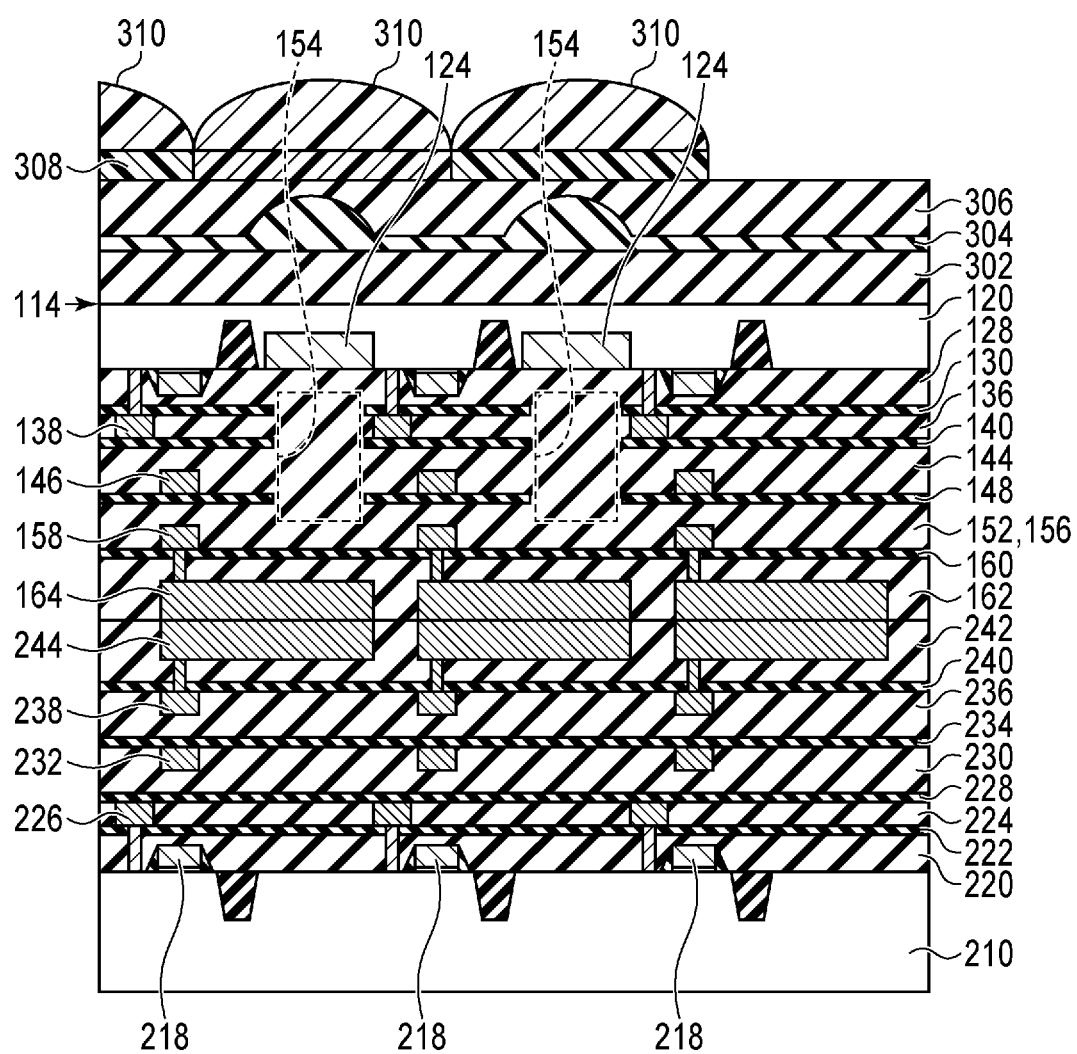

Next, the insulating film 302, the inner-layer lens 304, the insulating film 306, the color filter layer 308, the microlenses 310, and the like are formed on the second face 114 of the semiconductor layer 120 by using a known manufacturing process of photoelectric conversion devices, and the photoelectric conversion device according to the present embodiment is completed (FIG. 4C).

As described above, according to the present embodiment, hydrogen supply to a photoelectric converter can be facilitated, and noise occurring due to influence of a crystal defect in a silicon or an interface state between a silicon and an insulating film can be effectively reduced.

Second Embodiment

A method of manufacturing a photoelectric conversion device according to a second embodiment of the present invention will be described with reference to FIG. 5A to FIG. 5E. The same components as those of the photoelectric conversion device according to the first embodiment are labeled with the same references, and the description thereof will be omitted or simplified. FIG. 5A to FIG. 5E are cross-sectional views illustrating the method of manufacturing the photoelectric conversion device according to the present embodiment.

In the present embodiment, another method of manufacturing the photoelectric conversion device according to the first embodiment illustrated in FIG. 1 will be described.

First, the element isolation portions 122, the photoelectric converters 124, MOS transistors including the gate electrodes 126, the insulating films 128 and 130, the contact plugs 132, and the like are formed on the first face 112 side of the semiconductor substrate 110 (FIG. 5A) in the same manner as the manufacturing method according to the first embodiment.

Figure 5A:
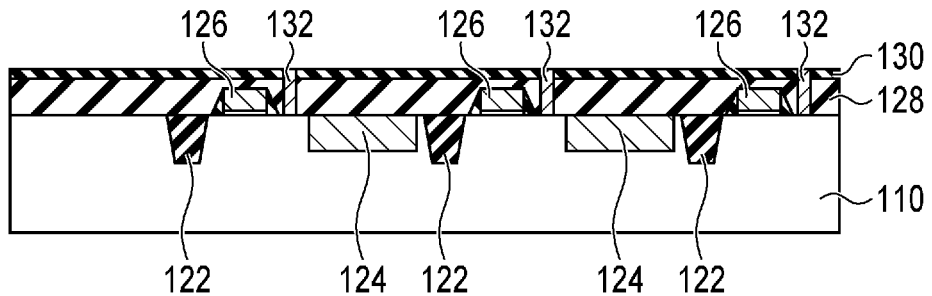
FIG. 5A, FIG. 5B, FIG. 5C, FIG. 5D, and FIG. 5E are cross-sectional views illustrating a method of manufacturing a photoelectric conversion device according to a second embodiment of the present invention.
Figure 5B:
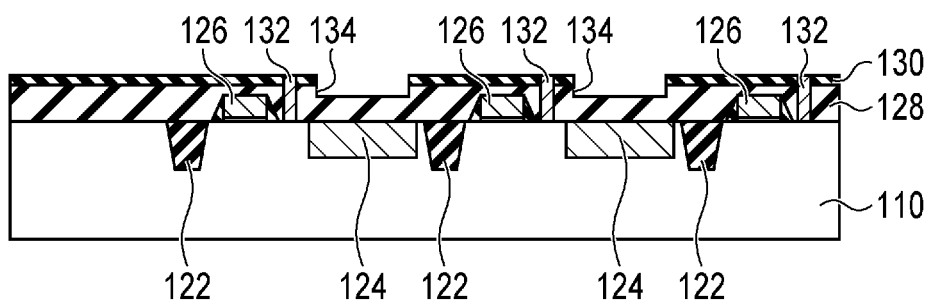

Next, openings 134 reaching at least the insulating film 128 are formed in the insulating film 130 over the photoelectric converters 124 by using photolithography and dry etching (FIG. 5B).

Next, the insulating film 136 is formed over the entire surface on the first face 112 side including the inside of the openings 134 by a known manufacturing process of semiconductor devices. For example, silicon oxide is deposited by using a deposition apparatus using plasma, such as a parallel plate plasma CVD apparatus, a high density plasma CVD apparatus, or the like to form the insulating film 136 made of a silicon oxide film. Thereby, the opening 134 is provided with the insulating film 136. The insulating film 136 may be planarized if necessary by a CMP method or the like after deposition.

Figure 5C:
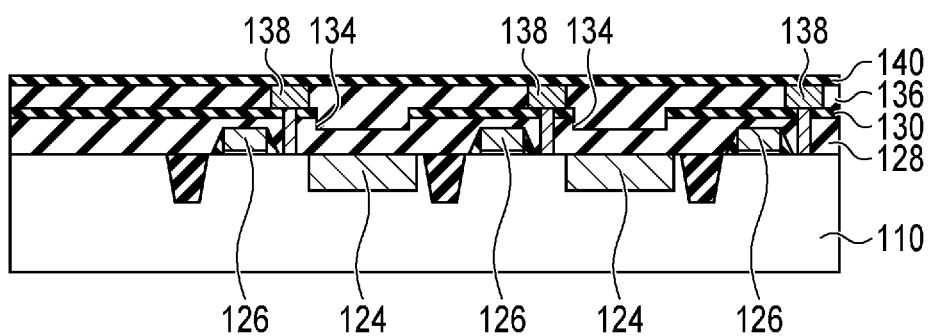
Figure 5D:
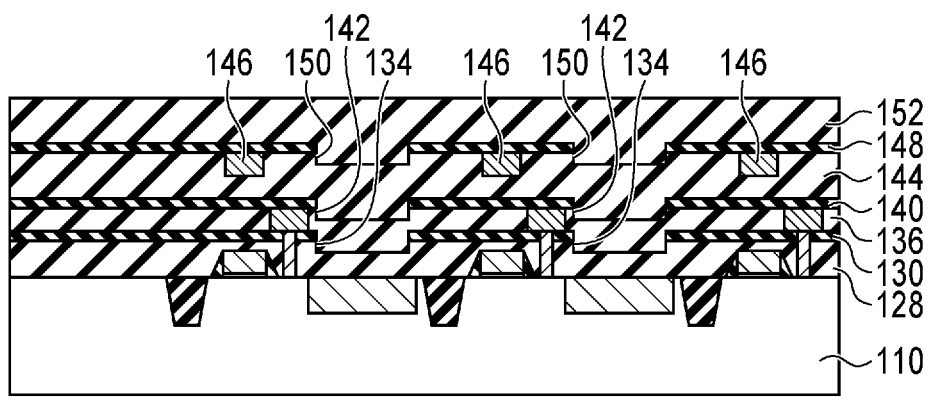
Figure 5E:
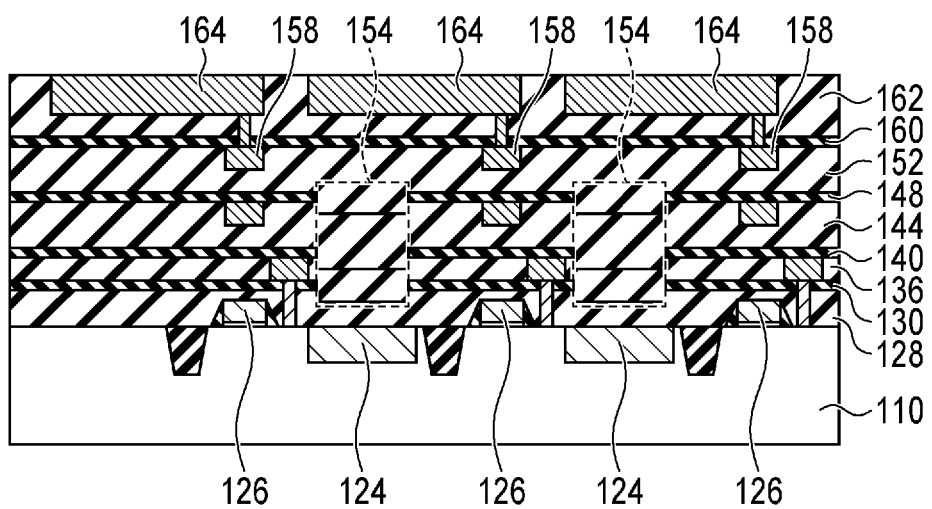

Next, the interconnection 138 arranged inside the insulating film 136, the insulating film 140 arranged over the insulating film 136 and the interconnection 138, and the like are formed by a known manufacturing process of semiconductor devices (FIG. 5C).

Next, openings 142 reaching at least the insulating film 136 are formed in the insulating film 140 on the photoelectric converter 124 by using photolithography and dry etching.

Next, the insulating film 144 is formed over the entire surface on the first face 112 side including the inside of the opening 142 by a known manufacturing process of semiconductor devices. For example, silicon oxide is deposited by using a deposition apparatus using plasma, such as a parallel plate plasma CVD apparatus, a high density plasma CVD apparatus, or the like to form the insulating film 144 made of a silicon oxide film. Thereby, the opening 142 is provided with the insulating film 144. The insulating film 144 may be planarized if necessary by a CM' method or the like after deposition.

Next, the interconnections 146, the insulating film 148, openings 150, the insulating films 152, and the like are formed (FIG. 5D) in the same manner as the interconnection 138, the insulating film 140, the openings 142, and the insulating films 144.

The openings 134, 142, and 150 formed in the insulating films 130, 140, and 148 in such a way are equivalent to the opening 154 in the first embodiment.

Next, the interconnection 158 arranged inside the insulating film 152, the insulating films 160 and 162 arranged over the insulating films 152 and the interconnection 158, the interconnection 164 arranged inside the insulating films 160 and 162, and the like are formed (FIG. 5E) in the same manner as the manufacturing method of the first embodiment.

As set forth, the first component 100 including photoelectric conversion elements before joined is completed.

The subsequent process including manufacturing of the second component 200, joining of the first component 100 and the second component 200, or the like is the same as those in the first embodiment.

Third Embodiment

Figure 6:
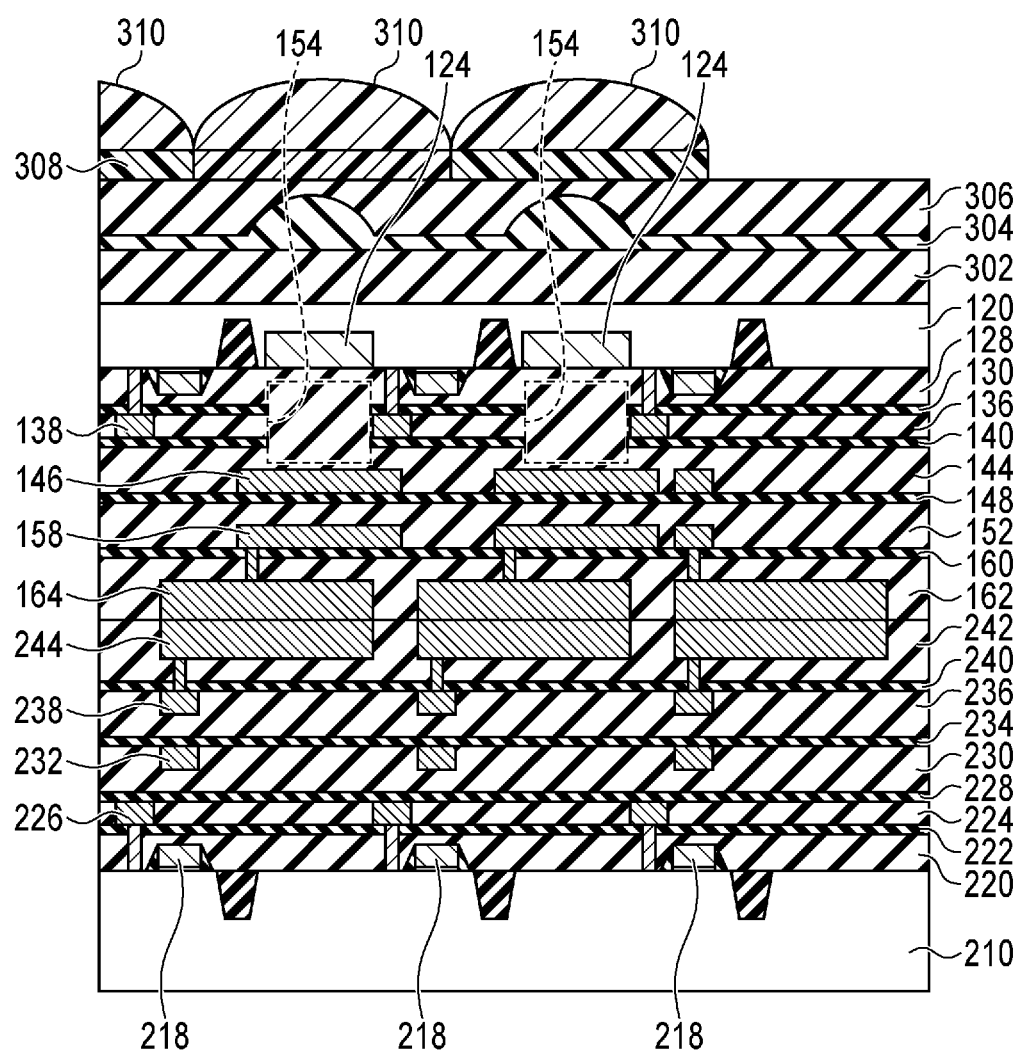
FIG. 6 is a cross-sectional view illustrating a general configuration of a photoelectric conversion device according to a third embodiment of the present invention.

A photoelectric conversion device and a method of manufacturing the same according to a third embodiment of the present invention will be described with reference to FIG. 6 to FIG. 8B. The same components as those of the photoelectric conversion device according to the first and second embodiments are labeled with the same references, and the description thereof will be omitted or simplified. FIG. 6 is a cross-sectional view illustrating a general configuration of the photoelectric conversion device according to the present embodiment.

As illustrated in FIG. 6, the photoelectric conversion device according to the present embodiment is different from the photoelectric conversion device according to the first embodiment in that the openings 154 are not provided in all the insulating films 130, 140, and 148 but are provided only in the insulating films 130 and 140. Other features are basically the same as those of the photoelectric conversion device according to the first embodiment.

By not providing the opening 154 in the insulating film 148, it is possible to improve flexibility in arrangement of the interconnection 146 arranged inside the insulating film 144. For example, the interconnection 146 can be arranged also in a region overlapping the photoelectric converter 124 in a projection plane when vertically projected on the projection plane parallel to the first face 112 of the semiconductor layer 120, as illustrated in FIG. 6. This can improve flexibility in the design of interconnections.

This feature is the same for the insulating film 160. By not providing the opening 154 in the insulating film 160, it is possible to improve flexibility in arrangement of the interconnection 158 arranged inside the insulating film 152. For example, the interconnection 158 can be arranged also in a region overlapping the photoelectric converter 124 in a projection plane when vertically projected on the projection plane parallel to the first face 112 of the semiconductor layer 120, as illustrated in FIG. 6. This can improve flexibility in the design of interconnections.

Next, the plan layout of the photoelectric converter 124, the insulating film 148, and the interconnection 146 will be described in more detail with reference to FIG. 7A to FIG. 8B.

Figure 7A:
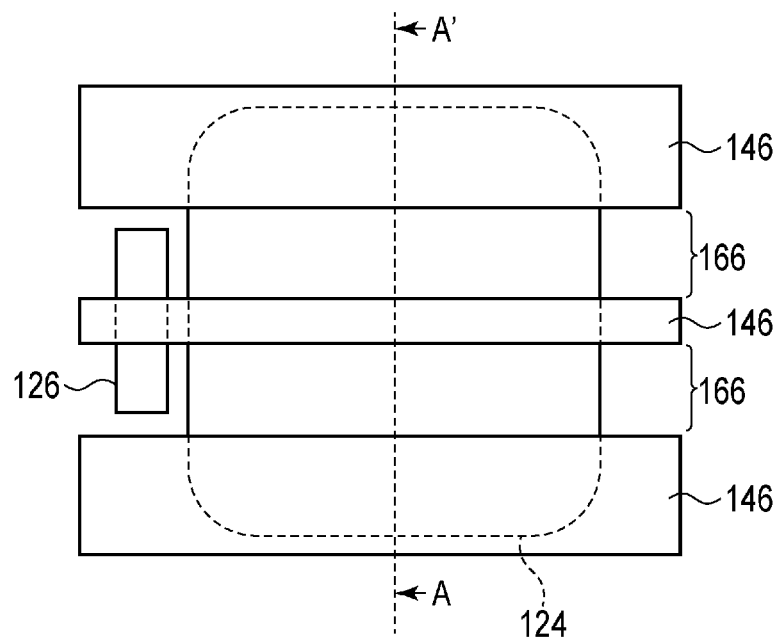
FIG. 7A is a plan view illustrating another configuration example of the photoelectric conversion device according to the third embodiment of the present invention.
Figure 7B:
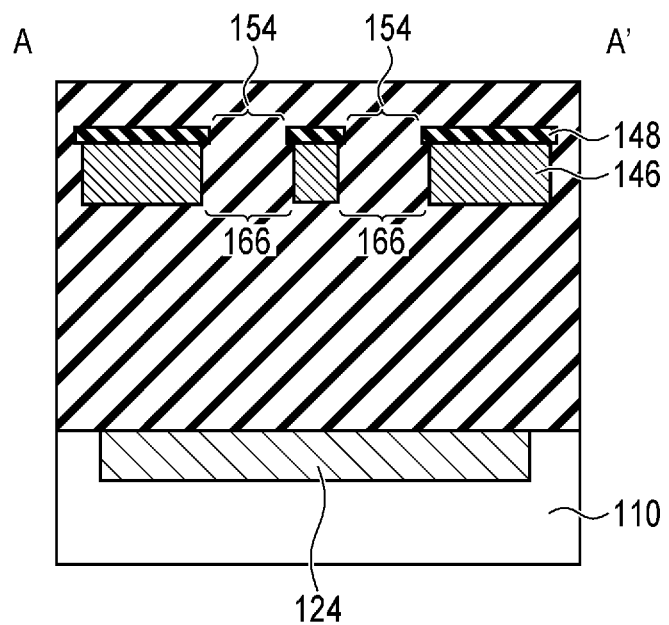
FIG. 7B is a cross-sectional view illustrating another configuration example of the photoelectric conversion device according to the third embodiment of the present invention.

FIG. 7A is a plan view in which the photoelectric converter 124 and the gate electrode 126 of a single pixel are extracted for illustration. This plan view corresponds to a projection view in which the photoelectric converter 124, the gate electrode 126, and the interconnections 146 are vertically projected on the projection plane parallel to the first face 112 of the semiconductor layer 120. FIG. 7B is a cross-sectional view taken along a line A-A' of FIG. 7A. FIG. 7A and FIG. 7B illustrate the insulating film 148 and the interconnection 146, and the same applies to the insulating film 160 and the interconnection 158. The layout of insulating film 148 and the interconnection 146 and the layout of the insulating film 160 and the interconnection 158 can be designed independently of each other.

In FIG. 7A, the interconnections 146 are arranged in a region partially overlapping the photoelectric converter 124. Other regions partially overlapping the photoelectric converter 124 overlap spaces 166 between the interconnections 146. The opening 154 can be arranged in at least a part of the region in which the spaces 166 overlap the photoelectric converter 124 in the same manner as the first and second embodiments. Note that the opening 154 is not necessarily required to be arranged in a region overlapping the photoelectric converter 124, and the interconnection 146 may be arranged in the entire region overlapping the photoelectric converter 124, and the opening 154 may be arranged in a region in which the interconnection 146 does not overlap the photoelectric converter 124. When hydrogen supply from the insulating films 128, 136, and 144 in the layers lower than the insulating film 148 is sufficient, the opening 154 may not be provided in the insulating film 148.

Figure 8A:
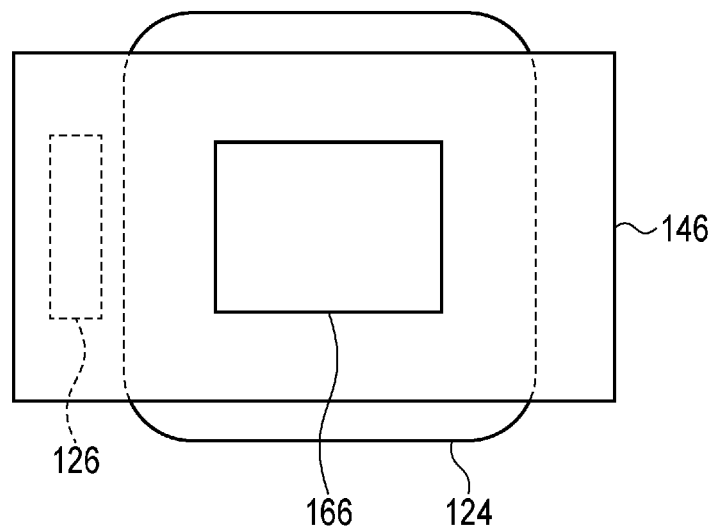
FIG. 8A and FIG. 8B are plan views illustrating another configuration example of a photoelectric conversion device according to the third embodiment of the present invention.
Figure 8B:
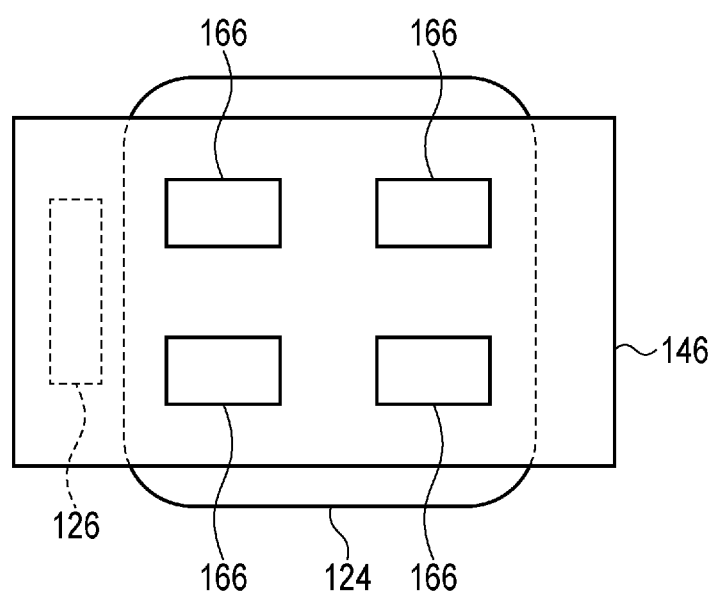

FIG. 8A and FIG. 8B illustrate another example of the plan layout of the photoelectric converter 124, the gate electrode 126, and the interconnection 146. The opening 154 is not necessarily required to be arranged in a region between the interconnections 146 and may be arranged in a region surrounded by a single interconnection 146.

In FIG. 8A and FIG. 8B, the space or spaces 166 are arranged so as to bore and penetrate the interconnection 146 in a part of a region in which the interconnection 146 overlaps the photoelectric converter 124. Also in such a case, the opening 154 can be arranged in at least a part of a region in which the space 166 overlaps the photoelectric converter 124 in the same manner as the first and second embodiments. FIG. 8A illustrates an example in which a single space 166 is arranged inside a region overlapping the photoelectric converter 124. FIG. 8B illustrates an example in which four spaces 166 are arranged in a lattice shape inside a region overlapping the photoelectric converter 124. The number or the arrangement of spaces 166 arranged inside the region overlapping the photoelectric converter 124 is not particularly limited.

The same manufacturing method as the manufacturing method of the first or second embodiment is applicable to the manufacturing method of the photoelectric conversion device according to the present embodiment.

As described above, according to the present embodiment, hydrogen supply to a photoelectric converter can be facilitated, and noise occurring due to influence of a crystal defect in a silicon or an interface state between a silicon and an insulating film can be effectively reduced.

Fourth Embodiment

Figure 9:
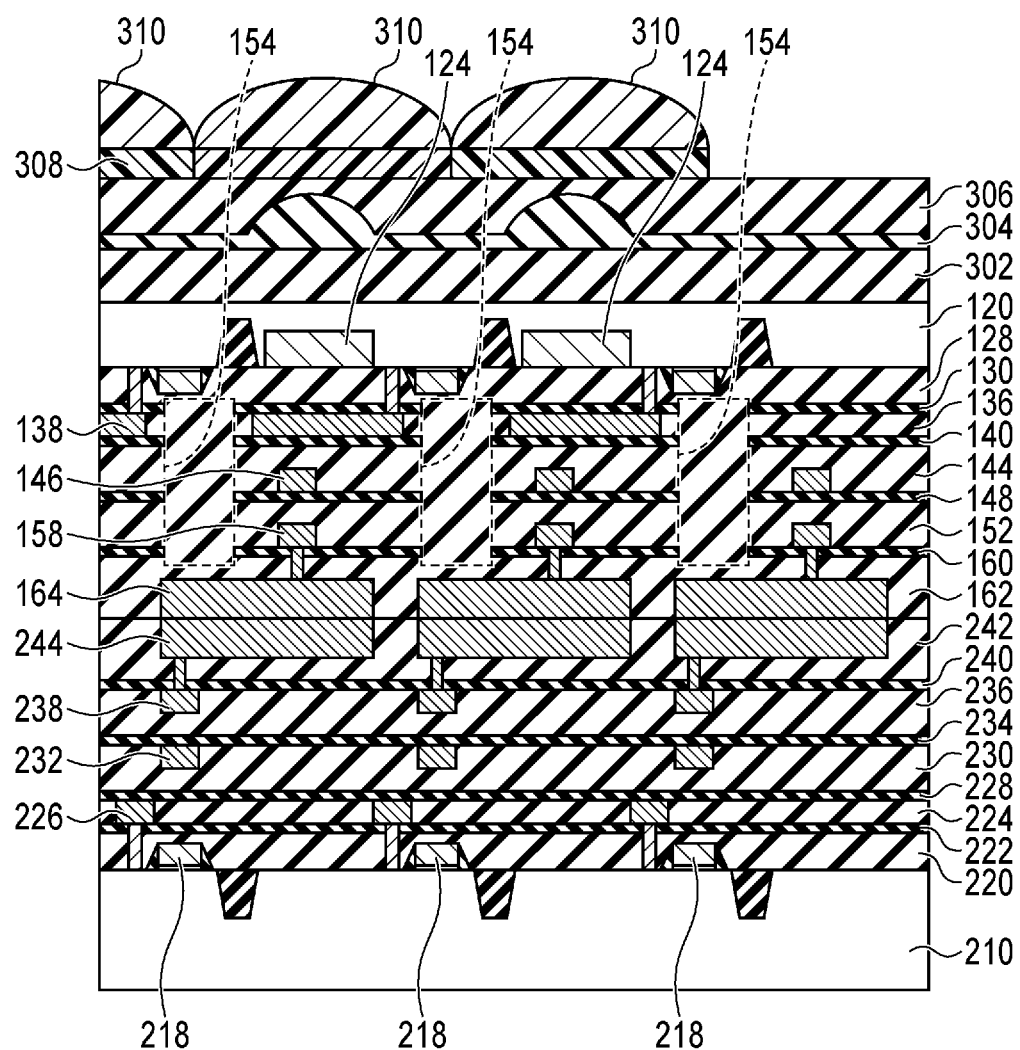
FIG. 9 is a cross-sectional view illustrating a general configuration of a photoelectric conversion device according to a fourth embodiment of the present invention.
Figure 10:
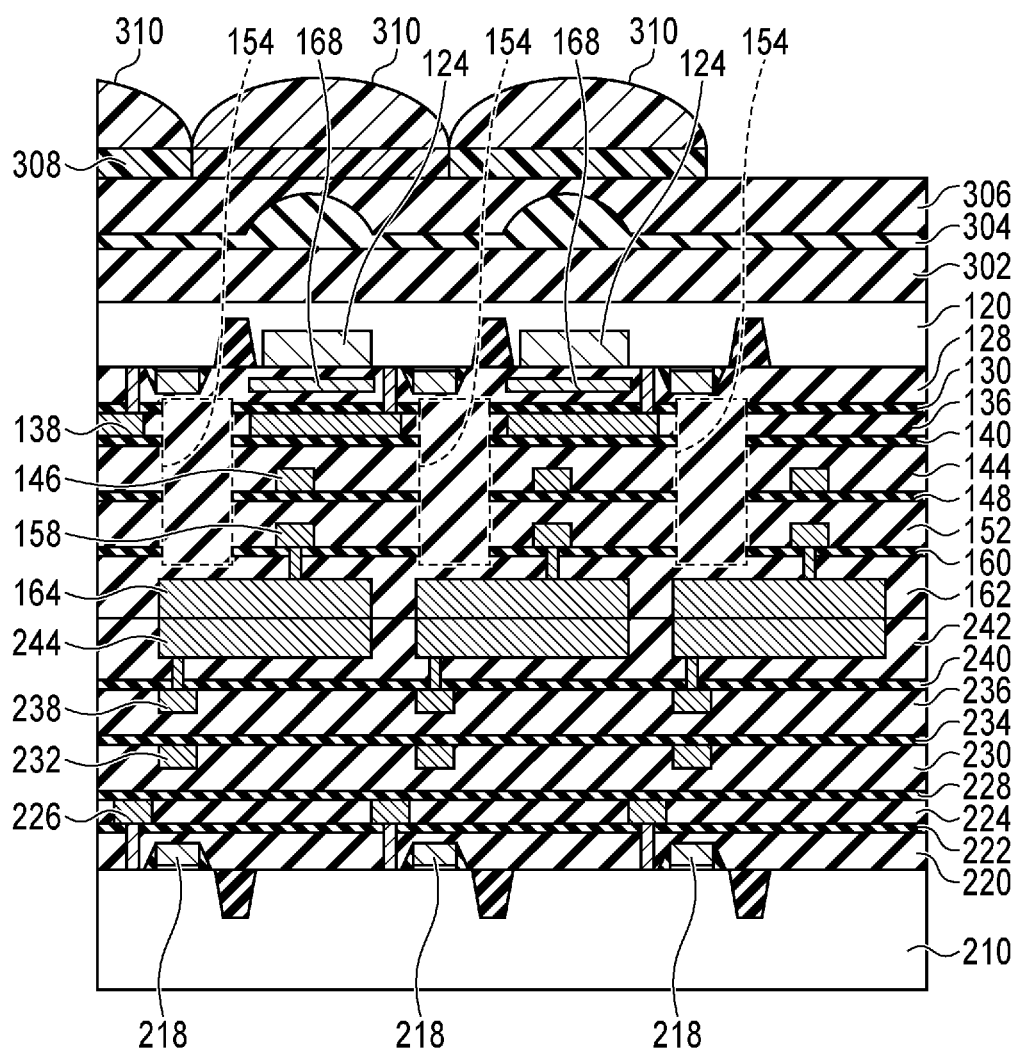
FIG. 10 is a cross-sectional view illustrating a general configuration of a photoelectric conversion device according to another example of the fourth embodiment of the present invention.

A photoelectric conversion device and a method of manufacturing the same according to a fourth embodiment of the present invention will be described with reference to FIG. 9 and FIG. 10. The same components as those of the photoelectric conversion device according to the first to third embodiments are labeled with the same references, and the description thereof will be omitted or simplified. FIG. 9 and FIG. 10 are cross-sectional views illustrating a general configuration of the photoelectric conversion device according to the present embodiment.

In the photoelectric conversion device according to the present embodiment, the interconnection 138 formed of the interconnection layer that is the closest to the semiconductor layer 120 is arranged in a region overlapping the photoelectric converter 124 in a projection plane when vertically projected on the projection plane parallel to the first face 112 of the semiconductor layer 120, as illustrated in FIG. 9.

By arranging the interconnection 138 in such a way, it is possible to cause light passing on the insulating film 128 side, out of light collected by the micro-lens 310 and entering the photoelectric converter 124, to be reflected by the interconnection 138 to re-enter the photoelectric converter 124. By using the interconnection 138 as a light reflection layer, it is possible to improve sensitivity to incident light and suppress light leakage to an adjacent pixel. Note that the interconnection 138 used as a light reflection layer is not necessarily required to be a literal "interconnection" or "electrode" but may be a metal member that does not serve as an electrical element in particular in terms of a function of the photoelectric conversion device. Such a metal member may be formed of a metal layer forming the interconnection layer including the interconnection 138.

Alternatively, a metal layer 168 that functions as a light reflection layer may be provided separately inside the insulating film 128 of a region overlapping the photoelectric converter 124 in a projection plane when vertically projected on the projection plane parallel to the first face 112 of the semiconductor layer 120, as illustrated in FIG. 10, for example. In such a case, the metal layer 168 can be formed of a metal material such as tungsten or aluminum, for example.

In FIG. 9 and FIG. 10, because the interconnection 138 and the metal layer 168 are laid out in such a way, the opening 154 is arranged in a region not overlapping the photoelectric converter 124 on the projection plane described above, for example, in a region between the photoelectric converters 124 of the adjacent pixels. Instead of shifting the position of the opening 154, the same plan layout as the interconnection 146 illustrated in FIG. 7A, FIG. 8A, or FIG. 8B may be applied to the interconnection 138 to arrange the opening 154 in a portion corresponding to the space 166.

The same manufacturing method as the manufacturing method of the first or second embodiment is applicable to the manufacturing method of the photoelectric conversion device according to the present embodiment.

As described above, according to the present embodiment, also in the structure in which a light reflection layer is arranged under the photoelectric converter, hydrogen supply to a photoelectric converter can be facilitated, and noise occurring due to influence of a crystal defect in a silicon or an interface state between a silicon and an insulating film can be effectively reduced.

Fifth Embodiment

Figure 11:
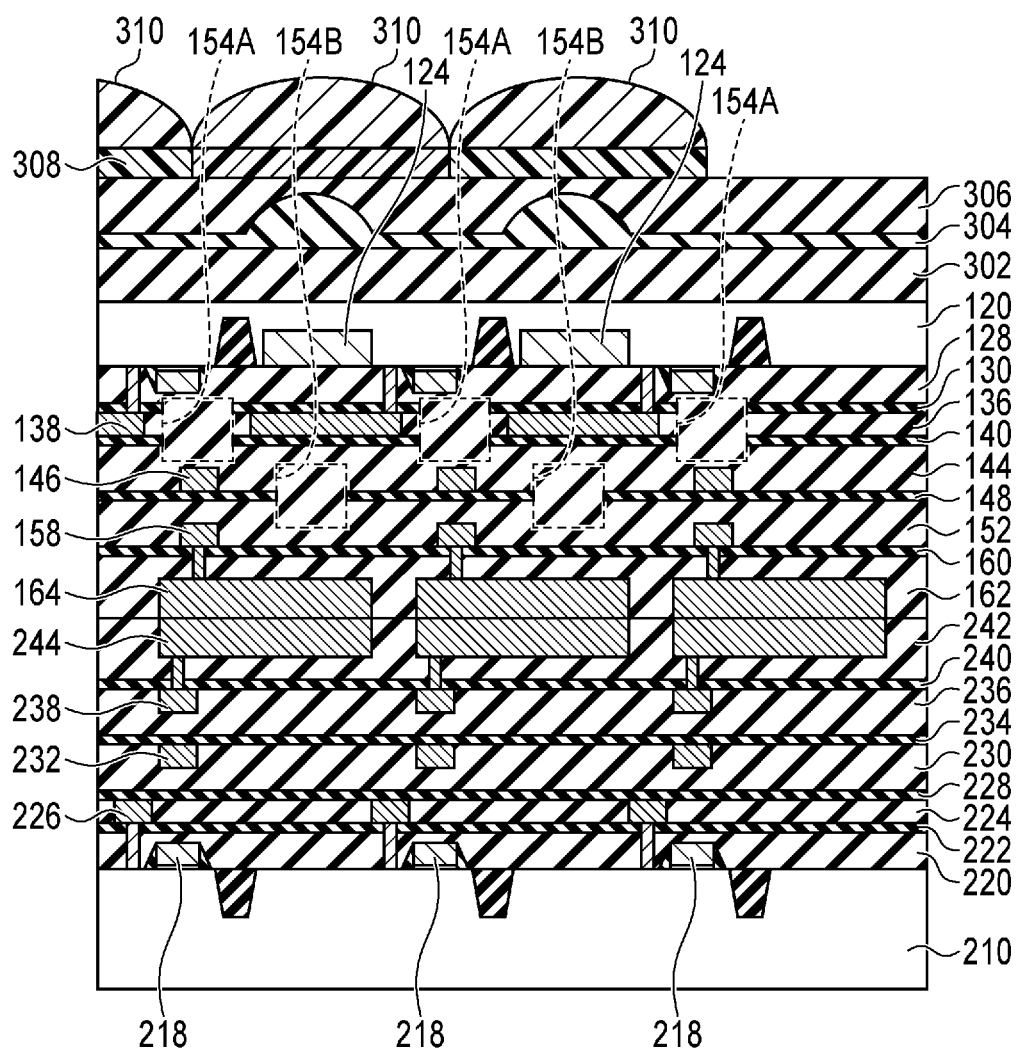
FIG. 11 is a cross-sectional view illustrating a general configuration of a photoelectric conversion device according to a fifth embodiment of the present invention.

A photoelectric conversion device and a method of manufacturing the same according to a fifth embodiment of the present invention will be described with reference to FIG. 11. The same components as those of the photoelectric conversion device according to the first to fourth embodiments are labeled with the same references, and the description thereof will be omitted or simplified. FIG. 11 is a cross-sectional view illustrating a general configuration of the photoelectric conversion device according to the present embodiment.

In the photoelectric conversion device according to the present embodiment, openings 154A provided in the insulating films 130 and 140 and openings 154B provided in the insulating film 148 are arranged in different regions on a projection plane when vertically projected on the projection plane parallel to the first face 112, as illustrated in FIG. 11. The opening 154A and the opening 154B may be partially overlapped or may not be overlapped.

Also when the openings 154A and 154B are arranged in such a way, diffusion paths of hydrogen that reach the photoelectric converter 124 can be secured via the openings 154B and 154A between the insulating film 152 and the insulating film 128. Therefore, also in the photoelectric conversion device according to the present embodiment, it is possible to enhance the dangling bond termination effect caused by hydrogen and effectively reduce noise or dark current occurring near the photoelectric converter 124 as with the case of the first to fourth embodiments.

Further, the feature that the openings 154 provided in the insulating films 130, 140, and 148 can be arranged in different regions, respectively, on the projection plane described above means that flexibility of the layout of each interconnection can be improved. That is, according to the present embodiment, it is possible to effectively reduce noise or dark current occurring near the photoelectric converter 124 without sacrificing flexibility of the layout of interconnections.

The same manufacturing method as the manufacturing method of the first or second embodiment is applicable to the manufacturing method of the photoelectric conversion device according to the present embodiment.

As described above, according to the present embodiment, hydrogen supply to a photoelectric converter can be facilitated, and noise occurring due to influence of a crystal defect in a silicon or an interface state between a silicon and an insulating film can be effectively reduced.

Sixth Embodiment

Figure 12:
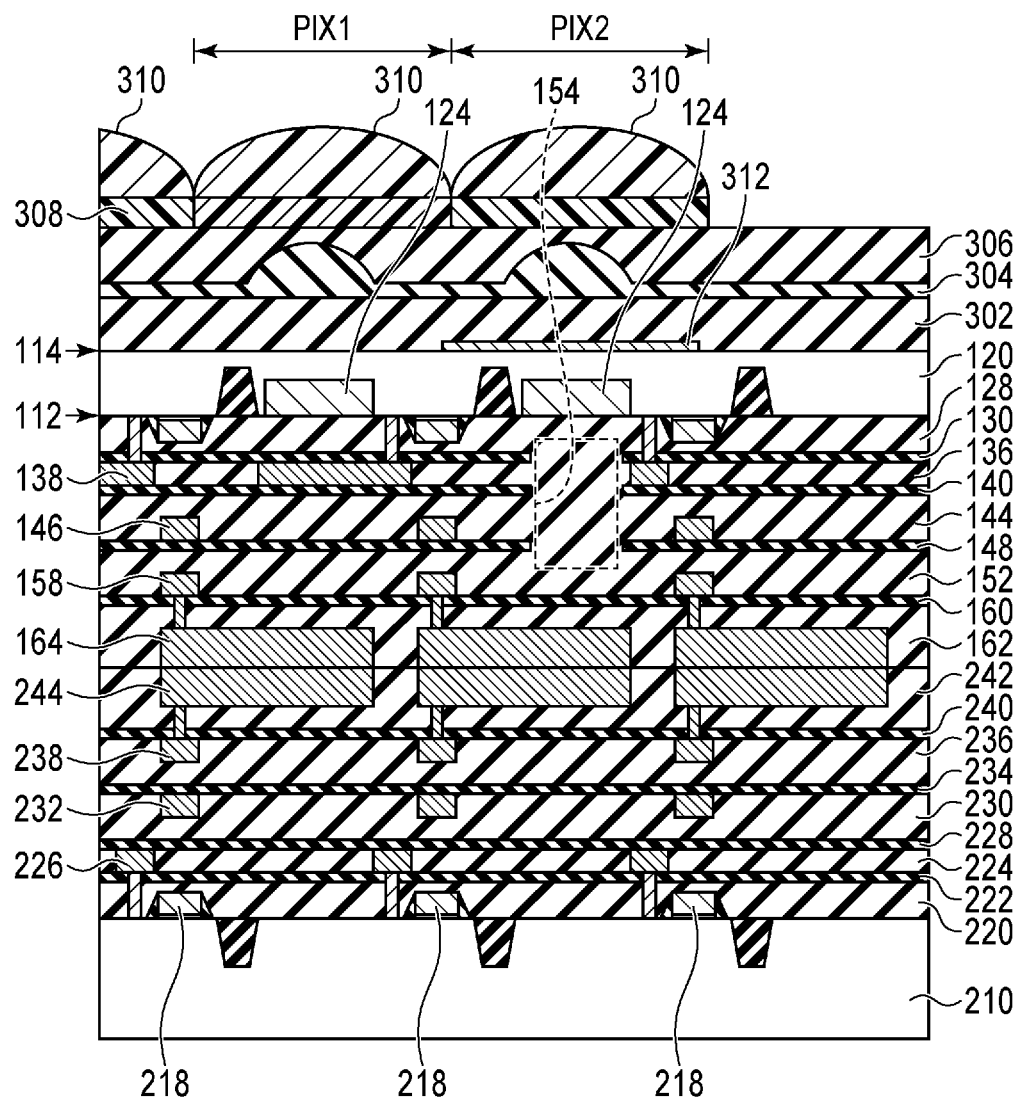
FIG. 12 is a cross-sectional view illustrating a general configuration of a photoelectric conversion device according to a sixth embodiment of the present invention.

A photoelectric conversion device and a method of manufacturing the same according to a sixth embodiment of the present invention will be described with reference to FIG. 12. The same components as those of the photoelectric conversion device according to the first to fifth embodiments are labeled with the same references, and the description thereof will be omitted or simplified. FIG. 12 is a cross-sectional view illustrating a general configuration of the photoelectric conversion device according to the present embodiment.

As illustrated in FIG. 12, the photoelectric conversion device according to the present embodiment includes a pixel PIX1 and a pixel PIX2 as at least some of a plurality of pixels arranged in the pixel region. The opening 154 having a larger opening area than the opening 154 provided in a region corresponding to the pixel PIX1 is provided in the interconnection structure 180 in a region corresponding to the pixel PIX2. FIG. 12 illustrates a case where the opening 154 is not provided in the region corresponding to the pixel PIX1 as a case where the opening area of the opening 154 provided in the region corresponding to the pixel PIX1 is the smallest. Note that the opening area herein is the area of the opening 154 on a projection plane when vertically projected on the projection plane parallel to the first face 112 of the semiconductor layer 120.

As an example, the pixel PIX1 may be a light receiving pixel (effective pixel), and the pixel PIX2 may be a light shielding pixel (optical black (OB) pixel). Herein, the light receiving pixel is a pixel that outputs a signal in accordance with a light amount of incident light. Further, the light shielding pixel is a pixel that outputs a reference signal in accordance with a dark current value. In this case, a plurality of pixels PIX1 are arranged in an array to form an effective pixel region, and a plurality of pixels PIX2 are arranged in an array to form an OB pixel region. A light shielding film 312 is provided on a light path of a light shielding pixel.

The pixel PIX2 can output a reference signal in accordance with a dark current value even if the opening 154 were not provided. In such a case, however, it is difficult to obtain, from the pixel PIX2, a reference signal indicating a reference dark current value equivalent to a dark current value in the pixel PIX1. This is because a difference in the amount of hydrogen reaching the photoelectric converter 124 occurs due to a structural difference between the pixel PIX1 and the pixel PIX2 and a difference also occurs in the dangling bond termination effect caused by hydrogen.

The hydrogen supply source to the photoelectric converter 124 may be an insulating material forming the inner-layer lens 304 or the like in addition to the insulating films 128, 136, 144, 152, 162, or the like forming the interconnection structure 180. The inner-layer lens 304 is formed of a film having a large hydrogen content, such as a silicon nitride film, and thus may be a hydrogen supply source at heating of the substrate.

In the pixel PIX2, however, the light shielding film 312 is provided on the second face 114 side of the semiconductor layer 120. The light shielding film 312 is formed of a metal material such as tungsten in general and is a film that prevents hydrogen diffusion. Thus, the amount of hydrogen supply from the second face 114 side of the semiconductor layer 120 to the pixel PIX2 is less than that to the pixel PIX1. As a result, the dark current reduction effect due to a dangling bond termination effect in the pixel PIX2 also becomes lower than that in the pixel PIX1, and a difference in the dark current value will occur between the pixel PIX1 and the pixel PIX2.

In terms of the above, the present embodiment is configured such that the amount of hydrogen supply from the first face 112 side of the semiconductor layer 120 to the pixel PIX2 is larger than that to the pixel PIX1 to reduce the difference in the amount of hydrogen supply to the pixel PIX1 and the pixel PIX2 as a whole. Specifically, with the opening 154 in the pixel PIX2 being larger than the opening 154 in the pixel PIX1, the amount of hydrogen supply from the first face 112 side of the semiconductor layer 120 to the pixel PIX2 can be larger than that to the pixel PIX1. Accordingly, it is possible to realize the photoelectric conversion device in which noise or dark current is reduced by a dangling bond termination effect caused by hydrogen while suppressing the difference in the dark current value between the pixel PIX1 and the pixel PIX2.

It is desirable that the opening area of the opening 154 be larger for a pixel arranged closer to the outer side (peripheral edge side) in the pixel region. Further, in each pixel, it is desirable that the opening 154 be arranged in the outer side (peripheral edge side) in the pixel region. With such a configuration, the difference in the amount of hydrogen supply to the photoelectric converter 124 can be reduced even when the amount of hydrogen supply is small in the outer side (peripheral edge side) in the pixel region, and in-plane unevenness of dark current can be suppressed.

Further, when the light reflection layer described in the fourth embodiment is arranged on the first face 112 side of the semiconductor layer 120, it is desirable that the foot area of the light reflection layer in the region corresponding to the pixel PIX2 be smaller than the foot area of the light reflection layer in the region corresponding to the pixel PIX1. FIG. 12 illustrates a case where the interconnection 138 is not arranged in a region of the pixel PIX2 that overlaps the photoelectric converter 124 as an example of the case where the foot area of the light reflection layer in the region corresponding to the pixel PIX2 is the smallest. With such a configuration, prevention of hydrogen supply due to the light reflection layer can be suppressed in the pixel PIX2, and along with the difference in the opening area of the openings 154, the amount of hydrogen supply from the first face 112 side of the semiconductor layer 120 to the pixel PIX2 can be larger than that to the pixel PIX1. The feature that the foot area of the light reflection layer in the pixel PIX2 is smaller than the foot area of the light reflection layer in the pixel PIX1 also provides an effect of suppressing light leakage to the OB pixel due to light reflection. Accordingly, it is possible to achieve both suppression of the difference in the dark current value between an effective pixel and an OB pixel and improvement of light shielding property in the OB pixel region.

In terms of suppressing the difference in the dark current value between the pixel PIX1 and the pixel PIX2, it is desirable that the hydrogen concentration per unit area included in the insulating film (including the element isolation portion 122) near the photoelectric converter 124 be higher in the pixel PIX2 than in the pixel PIX1. While the hydrogen concentration per unit area included in the insulating film (including the element isolation portion 122) near the photoelectric converter 124 may be higher in the pixel PIX1 than in the pixel PIX2, it is desirable that the difference in the hydrogen concentration be less than or equal to 5% in such a case.

As described above, according to the present embodiment, hydrogen supply to a photoelectric converter can be performed in accordance with the characteristic of pixels, and noise occurring due to influence of a crystal defect in a silicon or an interface state between a silicon and an insulating film can be effectively reduced.

Seventh Embodiment

Figure 13:
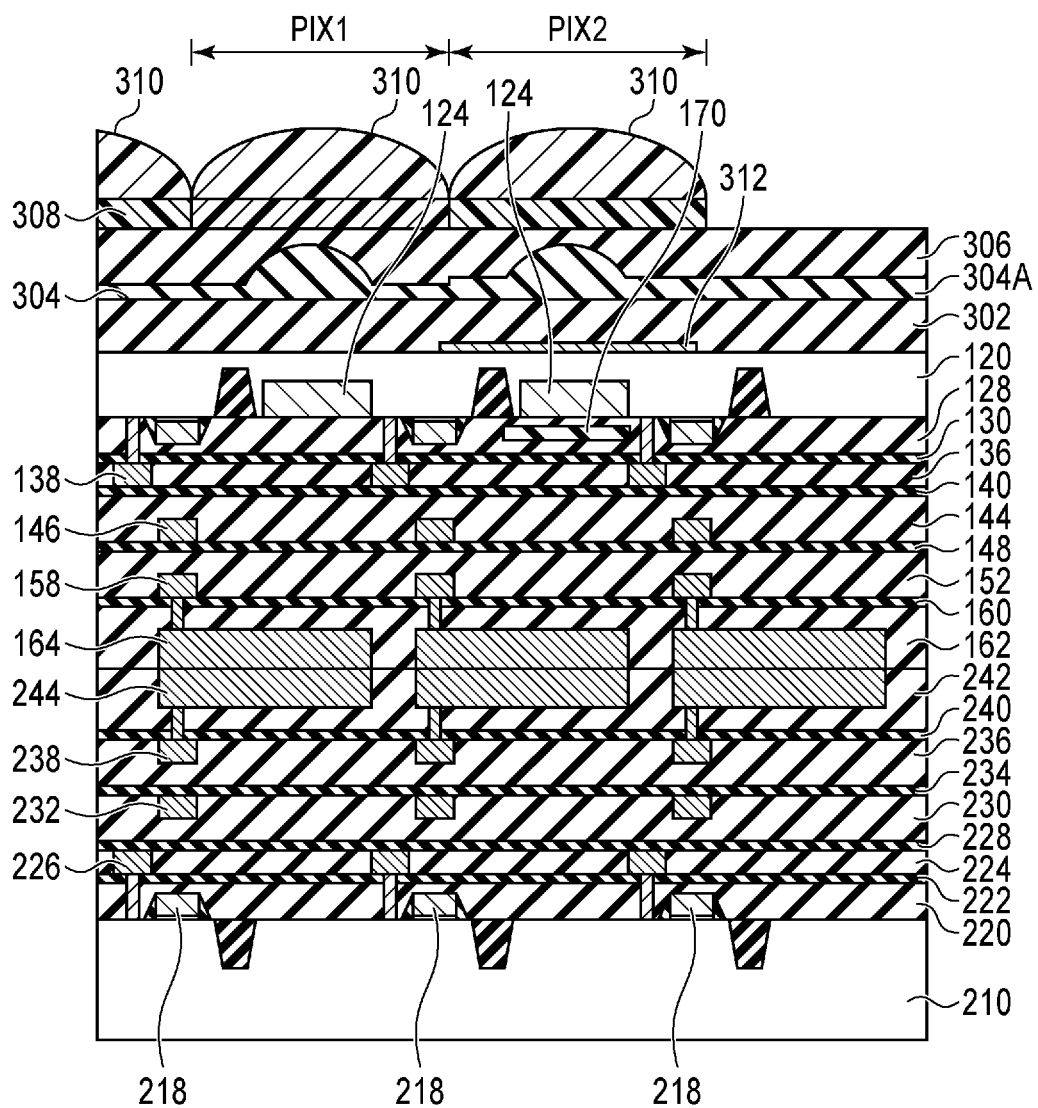
FIG. 13 is a cross-sectional view illustrating a general configuration of a photoelectric conversion device according to a seventh embodiment of the present invention.

A photoelectric conversion device and a method of manufacturing the same according to a seventh embodiment of the present invention will be described with reference to FIG. 13. The same components as those of the photoelectric conversion device according to the first to sixth embodiments are labeled with the same references, and the description thereof will be omitted or simplified. FIG. 13 is a schematic cross-sectional view illustrating a general configuration of the photoelectric conversion device according to the present embodiment.

In the photoelectric conversion device according to the present embodiment, an insulating member 170 having a larger hydrogen content than the insulating film 128 is selectively provided in the insulating film 128 of a region corresponding to the pixel PIX2, as illustrated in FIG. 13. Further, the volume of the insulating film forming the inner-layer lens 304 arranged in a region corresponding to the pixel PIX2 is larger than the volume of the insulating member forming the inner-layer lens 304 arranged in a region corresponding to the pixel PIX1. In other words, the volume of the insulating member forming the insulating member 170 or the inner-layer lens 304 in the region corresponding to the pixel PIX2 is larger than the volume of the insulating member 170 or the inner-layer lens 304 in the region corresponding to the pixel PIX1.

The insulating member 170 or the inner-layer lens 304 may be formed of an insulating material having a large hydrogen content, such as silicon nitride, for example, and may be a hydrogen supply source at heating of the substrate. Therefore, with the volume of the insulating member 170 or the inner-layer lens 304 in the pixel PIX2 being larger than the volume of the insulating member 170 or the inner-layer lens 304 in the pixel PIX1, the amount of hydrogen supply to the pixel PIX2 can be larger than the amount of hydrogen supply to the pixel PIX1.

It is desirable that there be neither a metal layer such as a light reflection layer or an interconnection layer nor a hydrogen supply prevention film such as the insulating film 130, 140, 148, or 160 between the photoelectric converter 124 and the insulating member 170 of the pixel PIX2. Further, the opening 154 may be provided in the interconnection structure 180 in addition that the insulating member 170 is added.

With such a configuration, more hydrogen can be supplied to the photoelectric converter 124 of the pixel PIX2 than to the photoelectric converter 124 of the pixel PIX1. Accordingly, it is possible to realize the photoelectric conversion device in which noise or dark current is reduced by a dangling bond termination effect caused by hydrogen while suppressing the difference in the dark current value between the pixel PIX1 and the pixel PIX2.

As described above, according to the present embodiment, hydrogen supply to a photoelectric converter can be performed in accordance with the characteristic of pixels, and noise occurring due to influence of a crystal defect in a silicon or an interface state between a silicon and an insulating film can be effectively reduced.

Eighth Embodiment

Figure 14:
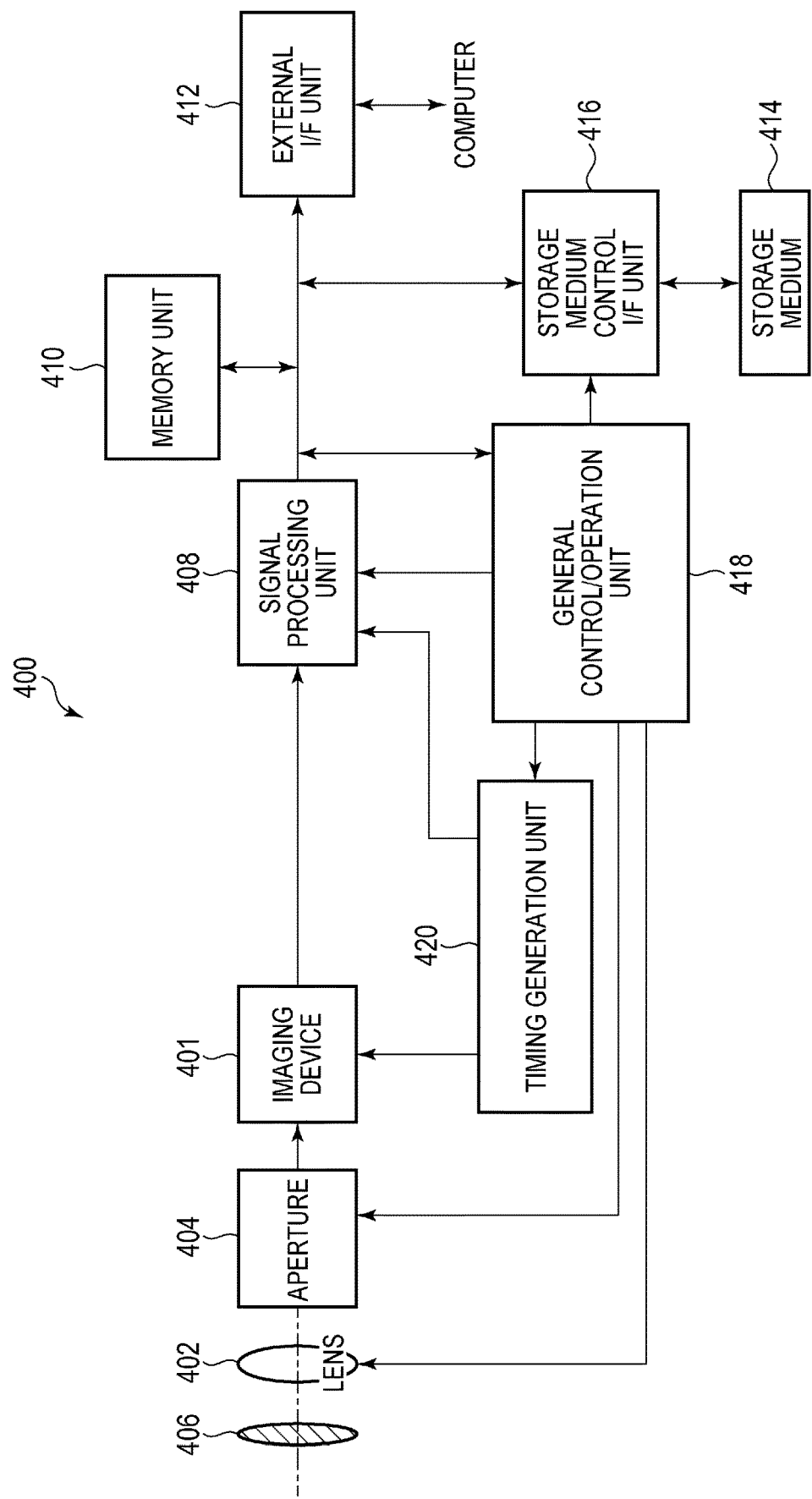
FIG. 14 is a block diagram illustrating a general configuration of an imaging system according to an eighth embodiment of the present invention.

An imaging system according to an eighth embodiment of the present invention will be described with reference to FIG. 14. FIG. 14 is a block diagram illustrating a general configuration of the imaging system according to the present embodiment.

The photoelectric conversion devices described in the above first to seventh embodiments can be applied to various imaging systems. An example of applicable imaging systems may be a digital still camera, a digital camcorder, a surveillance camera, a copying machine or a fax machine, a mobile phone, an on-vehicle camera, an observation satellite, or the like. Further, a camera module including an optical system such as a lens and an imaging device is also included in the imaging system. FIG. 14 illustrates a block diagram of a digital still camera as an example thereof.

An imaging system 400 illustrated as an example in FIG. 14 includes an imaging device 401, a lens 402 that captures an optical image of an object onto the imaging device 401, an aperture 404 for changing a light amount passing through the lens 402, and a barrier 406 for protecting the lens 402. The lens 402 and the aperture 404 form an optical system that converges a light onto the imaging device 401. The imaging device 401 is the photoelectric conversion device described in any of the first to seventh embodiments and converts an optical image captured by the lens 402 into image data.

The imaging system 400 further includes a signal processing unit 408 that processes an output signal output from the imaging device 401. The signal processing unit 408 performs AD conversion that converts an analog signal output by the imaging device 401 into a digital signal. In addition, the signal processing unit 408 performs various correction and compression other than the above, if necessary, and outputs image data. An AD conversion unit, which is a part of the signal processing unit 408, may be formed on a semiconductor substrate on which the imaging device 401 is provided or may be formed on a semiconductor substrate on which the imaging device 401 is not provided. Further, the imaging device 401 and the signal processing unit 408 may be formed on the same semiconductor substrate.

The imaging system 400 further includes a memory unit 410 for temporarily storing image data therein and an external interface unit (external I/F unit) 412 for communicating with an external computer or the like. The imaging system 400 further includes a storage medium 414 such as a semiconductor memory for performing storage or readout of imaging data and a storage medium control interface unit (storage medium control I/F unit) 416 for performing storage or readout on the storage medium 414. Note that the storage medium 414 may be embedded in the imaging system 400 or may be removable.

Further, the imaging system 400 includes a general control/operation unit 418 that controls various operations and the entire digital still camera and a timing generation unit 420 that outputs various timing signals to the imaging device 401 and the signal processing unit 408. Here, the timing signal or the like may be input from the outside, and the imaging system 400 may have at least the imaging device 401 and the signal processing unit 408 that processes an output signal output from the imaging device 401.

The imaging device 401 outputs an imaging signal to the signal processing unit 408. The signal processing unit 408 performs predetermined signal processing on an imaging signal output from the imaging device 401 and outputs image data. The signal processing unit 408 uses an imaging signal to generate an image.

As discussed above, according to the present embodiment, the imaging system to which the photoelectric conversion device according to the first to seventh embodiments is applied can be implemented.

Ninth Embodiment

Figure 15A:
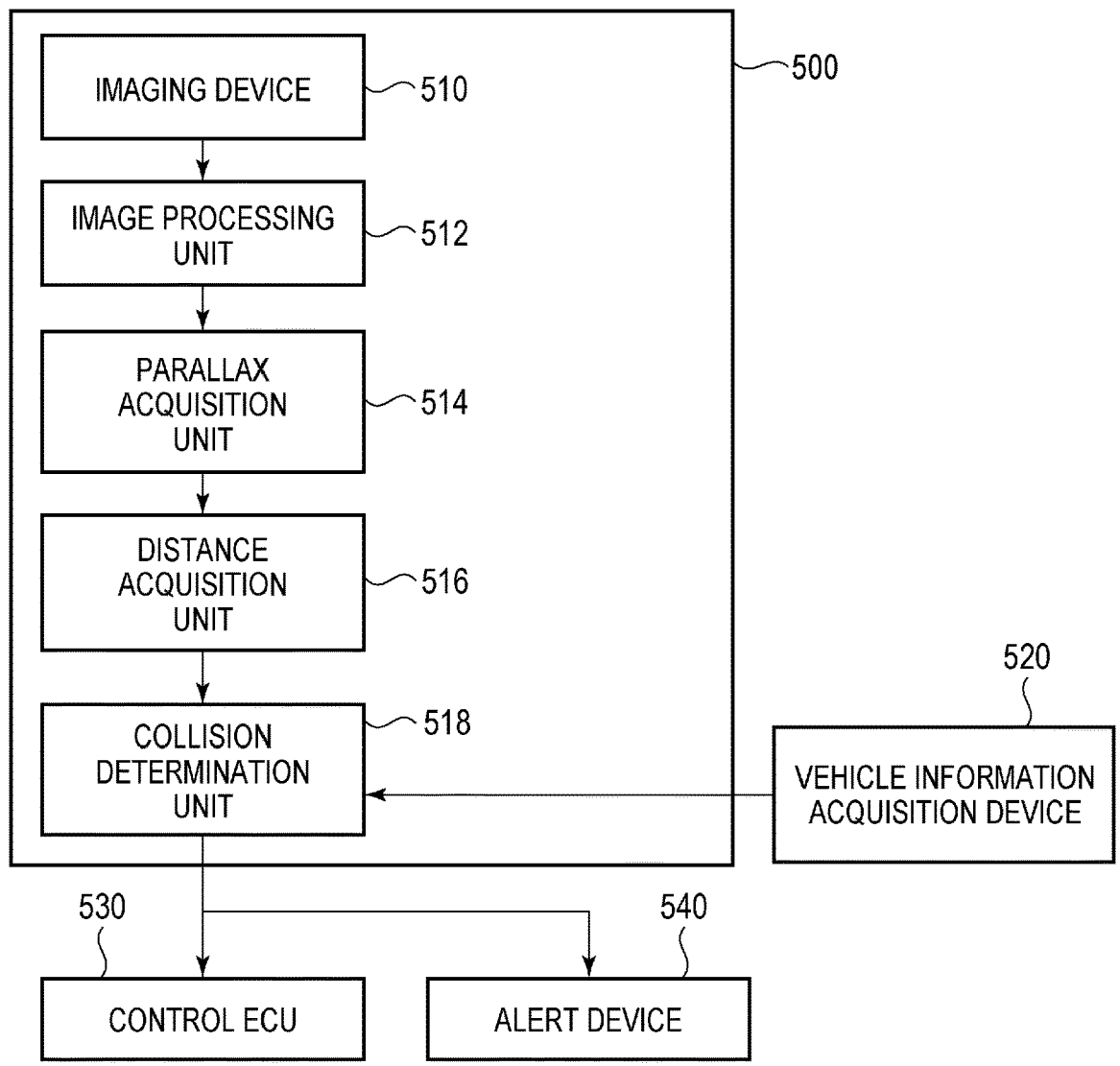
FIG. 15A is a diagram illustrating a configuration example of an imaging system according to a ninth embodiment of the present invention.
Figure 15B:
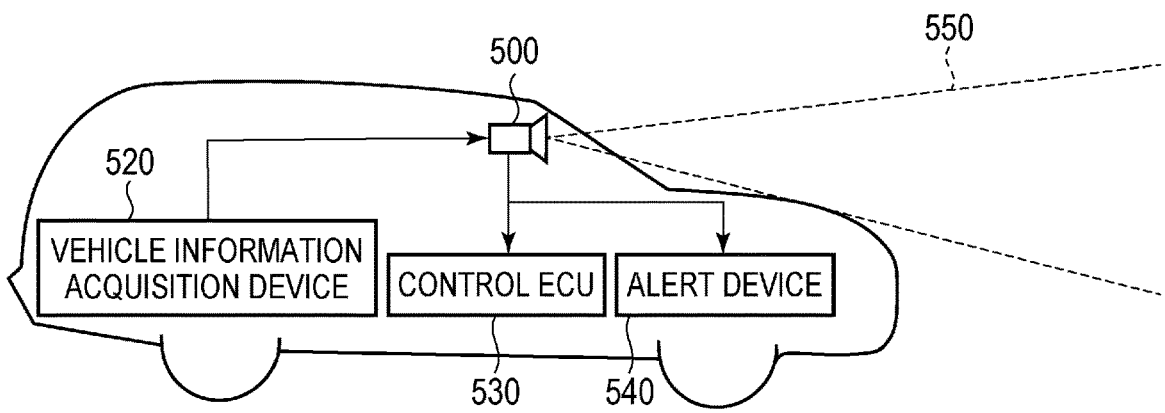
FIG. 15B is a diagram illustrating a configuration example of a movable object according to the ninth embodiment of the present invention.

An imaging system and a movable object according to a ninth embodiment of the present invention will be described with reference to FIG. 15A and FIG. 15B. FIG. 15A is a diagram illustrating a configuration of the imaging system according to the present embodiment. FIG. 15B is a diagram illustrating a configuration of the movable object according to the present embodiment.

FIG. 15A illustrates an example of an imaging system related to an on-vehicle camera. An imaging system 500 includes an imaging device 510. The imaging device 510 is the photoelectric conversion device described in any of the first to seventh embodiments described above. The imaging system 500 includes an image processing unit 512 that performs image processing on a plurality of image data acquired by the imaging device 510 and a parallax acquisition unit 514 that calculates a parallax (a phase difference of parallax images) from the plurality of image data acquired by the imaging system 500. Further, the imaging system 500 includes a distance acquisition unit 516 that calculates a distance to the object based on the calculated parallax and a collision determination unit 518 that determines whether or not there is a collision possibility based on the calculated distance. Here, the parallax acquisition unit 514 and the distance acquisition unit 516 are an example of a distance information acquisition unit that acquires distance information on the distance to the object. That is, the distance information is information on a parallax, a defocus amount, a distance to an object, or the like. The collision determination unit 518 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by combination thereof.

The imaging system 500 is connected to the vehicle information acquisition device 520 and can acquire vehicle information such as a vehicle speed, a yaw rate, a steering angle, or the like. Further, the imaging system 500 is connected to a control ECU 530, which is a control device that outputs a control signal for causing a vehicle to generate braking force based on a determination result by the collision determination unit 518. Further, the imaging system 500 is also connected to an alert device 540 that issues an alert to the driver based on a determination result by the collision determination unit 518. For example, when the collision probability is high as the determination result of the collision determination unit 518, the control ECU 530 performs vehicle control to avoid a collision or reduce damage by applying a brake, pushing back an accelerator, suppressing engine power, or the like. The alert device 540 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 500. FIG. 15B illustrates the imaging system when a front area of a vehicle (a capturing area 550) is captured. The vehicle information acquisition device 520 transmits an instruction to the imaging system 500 or the imaging device 510. Such a configuration can further improve the ranging accuracy.

Further, although the example of control for avoiding a collision to another vehicle has been described above in the present embodiment, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, although an effective pixel is assumed as the pixel PIX1 and an OB pixel is assumed as the pixel PIX2 in the sixth and seventh embodiments described above, the pixels PIX1 and PIX2 are not limited to such a combination.

Further, the imaging systems illustrated in the eighth and ninth embodiments described above are examples of an imaging system to which the photoelectric conversion device of the present invention may be applied, and an imaging system to which the photoelectric conversion device of the present invention can be applied is not limited to the configuration illustrated in FIG. 14 and FIG. 15A.

The photoelectric conversion device of the present invention can be widely applied to equipment using object recognition without being limited to imaging systems or movable objects. The scope of the equipment as used herein includes electronic equipment (cameras, smartphones, and the like), office equipment (scanners and the like), transport equipment (vehicles, ships, airplanes, and the like), medical equipment (endoscopes, radiographic inspection equipment, and the like), analysis equipment (SEMs, TEMs, and the like), industry equipment (robots and the like), and the like. These equipment may be configured including the photoelectric conversion device described in the above embodiments and a signal processing device that processes a signal output from that photoelectric conversion device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-098499, filed May 27, 2019 which is hereby incorporated by reference herein in its entirety.

What is claimed is:

1. A photoelectric conversion device comprising:
a semiconductor layer in which a photoelectric converter is provided;
a substrate arranged on one face side of the semiconductor layer; and
an interconnection structure arranged between the semiconductor layer and the substrate,
wherein light enters the photoelectric converter from another face side of the semiconductor layer,
wherein the interconnection structure includes at least one first insulating film made of a first insulating material, at least one second insulating film provided between the semiconductor layer and the first insulating film and made of a second insulating material, and a plurality of interconnection layers,
wherein the first insulating material permeates more hydrogen than the second insulating material, and
wherein an insulating member made of the first insulating material is located between the plurality of interconnection layers located between the first insulating film and the semiconductor layer, and the first insulating film and the insulating member are connected to each other via an opening provided in the second insulating film.

2. The photoelectric conversion device according to claim 1, wherein when vertically projected on a projection plane parallel to a primary face of the semiconductor layer, at least a part of the opening and the photoelectric converter are overlapped on the projection plane.

3. The photoelectric conversion device according to claim 1, wherein the interconnection structure includes a plurality of first insulating films and a plurality of second insulating films and has a multilayer stack in which the plurality of first insulating films and the plurality of second insulating films are stacked alternately,
wherein a first insulating film of the plurality of first insulating films which is closest to the semiconductor layer among the plurality of first insulating films is provided between the semiconductor layer and a second insulating film of the plurality of second insulating films which is closest to the semiconductor layer among the plurality of second insulating films, and
wherein the opening is provided in at least two of the first insulating films on the semiconductor layer side.

4. The photoelectric conversion device according to claim 3, wherein when vertically projected on a projection plane parallel to a primary face of the semiconductor layer, the opening provided in one second insulating film of the plurality of second insulating films and the opening provided in another second insulating film of the plurality of second insulating films are arranged in different regions on the projection plane.

5. The photoelectric conversion device according to claim 4, wherein the opening provided in the one second insulating film and the opening provided in the other second insulating film are at least partially overlapped on the projection plane.

6. The photoelectric conversion device according to claim 1, wherein when vertically projected on a projection plane parallel to a primary face of the semiconductor layer, the interconnection structure has an interconnection overlapping the opening on the projection plane.

7. The photoelectric conversion device according to claim 1, wherein the when vertically projected on a projection plane parallel to a primary face of the semiconductor layer, an interconnection layer of the plurality of interconnection layers which is closest to the semiconductor layer among the plurality of interconnection layers has a metal member at least partially overlapping the photoelectric converter on the projection plane.

8. The photoelectric conversion device according to claim 1, wherein the interconnection structure has a metal member that, when vertically projected on a projection plane parallel to a primary face of the semiconductor layer, at least partially overlaps the photoelectric converter on the projection plane between the semiconductor layer and an interconnection layer of the plurality of interconnection layers which is closest to the semiconductor layer among the plurality of interconnection layers.

9. A photoelectric conversion device comprising:
a semiconductor layer in which a pixel region including a plurality of pixels each including a photoelectric converter is provided;
a substrate arranged on one face side of the semiconductor layer; and
an interconnection structure arranged between the semiconductor layer and the substrate,
wherein the interconnection structure includes a first insulating film made of a first insulating material and a second insulating film provided between the semiconductor layer and the first insulating film and made of a second insulating material,
wherein the first insulating material permeates more hydrogen than the second insulating material,
wherein an insulating member made of the first insulating material is located between the first insulating film and the semiconductor layer, and the first insulating film and the insulating member are connected to each other via an opening provided in the second insulating film, and
wherein an opening area of the opening provided in a region corresponding to a first pixel is smaller than an opening area of the opening provided in a region corresponding to a second pixel.

10. The photoelectric conversion device according to claim 9, wherein the opening area of the opening is larger for the opening corresponding to a pixel which is closer to a peripheral edge of the pixel region.

11. The photoelectric conversion device according to claim 9, wherein the interconnection structure has a plurality of interconnection layers, and when vertically projected on a projection plane parallel to a primary face of the semiconductor layer, an interconnection layer of the plurality of interconnection layers which is closest to the semiconductor layer among the plurality of interconnection layers has a metal member at least partially overlapping the photoelectric converter on the projection plane, and
wherein a foot area of the metal member arranged in a region overlapping the photoelectric converter of the first pixel is larger than a foot area of the metal member arranged in a region overlapping the photoelectric converter of the second pixel on the projection plane.

12. A photoelectric conversion device comprising:
a semiconductor layer in which a pixel region including a plurality of pixels each including a photoelectric converter is provided;
a substrate arranged on one face side of the semiconductor layer; and
an interconnection structure arranged between the semiconductor layer and the substrate,
wherein the interconnection structure includes a plurality of first insulating films made of a first insulating material and a plurality of second insulating films made of a second insulating material and has a multilayer stack in which the plurality of first insulating films and the plurality of second insulating films are stacked alternately, and a first insulating film of the plurality of first insulating films which is closest to the semiconductor layer among the plurality of first insulating films is provided between the semiconductor layer and a second insulating film of the plurality of second insulating films which is closest to the semiconductor layer among the plurality of second insulating films,
wherein the first insulating material permeates more hydrogen than the second insulating material,
wherein the photoelectric conversion device further comprises an insulating member having a higher hydrogen content than the plurality of first insulating films inside the first insulating film of the plurality of first insulating films which is closest to the semiconductor layer among the plurality of first insulating films or on the other face side of the semiconductor layer, and
wherein a volume of the insulating member provided in a portion corresponding to a first pixel is smaller than a volume of the insulating member provided in a portion corresponding to a second pixel.

13. The photoelectric conversion device according to claim 9, further comprising a light shielding film arranged on the other face side of the semiconductor layer,
wherein the light shielding film overlaps a region corresponding to the first pixel and does not overlap a region corresponding to the second pixel.

14. The photoelectric conversion device according to claim 1, wherein the first insulating material contains hydrogen.

15. The photoelectric conversion device according to claim 1, wherein the first insulating material is silicon oxide or silicon oxycarbide.

16. The photoelectric conversion device according to claim 1, wherein the second insulating material is silicon carbide, silicon nitride, or silicon carbonitride.

17. The photoelectric conversion device according to claim 1, further comprising an optical structure arranged on the other face side of the semiconductor layer.

18. The photoelectric conversion device according to claim 1, further comprising a transistor provided on the substrate.

19. An equipment comprising:
the photoelectric conversion device according to claim 1; and
a signal processing device that processes a signal output from the photoelectric conversion device.

20. The photoelectric conversion device according to claim 1, wherein the one face side of the semiconductor layer is located between the other face side of the semiconductor layer and the insulating member, and the second insulating film is located between the insulating member and the first insulating film.

* * * * *